(12) United States Patent
Pronovost

(10) Patent No.: US 12,339,658 B2
(45) Date of Patent: Jun. 24, 2025

(54) GENERATING A SCENARIO USING A VARIABLE AUTOENCODER CONDITIONED WITH A DIFFUSION MODEL

(71) Applicant: Zoox, Inc., Foster City, CA (US)

(72) Inventor: Ethan Miller Pronovost, Redwood City, CA (US)

(73) Assignee: Zoox, Inc., Foster City, CA (US)

(*) Notice: Subject to any disclaimer, the term of this patent is extended or adjusted under 35 U.S.C. 154(b) by 251 days.

(21) Appl. No.: 18/087,609

(22) Filed: Dec. 22, 2022

(65) Prior Publication Data

US 2024/0210942 A1    Jun. 27, 2024

(51) Int. Cl.
| | |
|---|---|
| G05D 1/00 | (2024.01) |
| G06F 30/15 | (2020.01) |
| G06N 3/0475 | (2023.01) |
| G06N 3/094 | (2023.01) |
| G06V 10/25 | (2022.01) |
| G06V 10/82 | (2022.01) |
| G06V 20/59 | (2022.01) |

(52) U.S. Cl.
CPC ........... *G05D 1/0088* (2013.01); *G06F 30/15* (2020.01); *G06N 3/0475* (2023.01); *G06N 3/094* (2023.01); *G06V 10/25* (2022.01); *G06V 10/82* (2022.01); *G06V 20/59* (2022.01)

(58) Field of Classification Search
CPC ...... G05D 1/0088; G06F 30/15; G06V 20/59; G06V 10/25; G06V 10/82; G06N 3/094; G06N 3/0475

See application file for complete search history.

(56) References Cited

U.S. PATENT DOCUMENTS

| | | |
|---|---|---|
| 10,019,011 B1 | 7/2018 | Green et al. |
| 10,086,782 B1 | 10/2018 | Konrardy et al. |
| 10,421,453 B1 | 9/2019 | Ferguson et al. |
| 10,459,444 B1 | 10/2019 | Kentley-Klay |
| 10,671,076 B1 | 6/2020 | Kobilarov et al. |
| 11,200,679 B1 * | 12/2021 | Li .............................. G06T 7/77 |
| 11,370,424 B1 | 6/2022 | Cohen et al. |
| 11,960,292 B2 | 4/2024 | Nayhouse et al. |

(Continued)

FOREIGN PATENT DOCUMENTS

CN          113936243          1/2022

OTHER PUBLICATIONS

Arsal Syed, "Forecasting Pedestrian Trajectory Using Deep Learning y Using Deep Learning," 2021 (Year: 2021).*

(Continued)

*Primary Examiner* — Andrew J Cromer
(74) *Attorney, Agent, or Firm* — Lee & Hayes, P.C.

(57) ABSTRACT

Techniques for performing a simulation using a variable autoencoder conditioned with a diffusion model are described herein. For example, the techniques may include a decoder of a variable autoencoder receiving latent variable data representing an action, intent, or attribute of an object from the diffusion model and outputting occupancy information for an object. The occupancy information can be input into a prediction component associated with a vehicle computing device of a vehicle. The prediction component can output a predicted state for one or more objects proximate the vehicle and perform a simulation between the vehicle and the one or more objects.

20 Claims, 11 Drawing Sheets

(56) References Cited

U.S. PATENT DOCUMENTS

| | | |
|---|---|---|
| 2017/0132334 A1 | 5/2017 | Levinson et al. |
| 2019/0072966 A1 | 3/2019 | Zhang et al. |
| 2019/0129436 A1 | 5/2019 | Sun et al. |
| 2019/0147610 A1 | 5/2019 | Frossard et al. |
| 2019/0152490 A1 | 5/2019 | Lan et al. |
| 2019/0164007 A1 | 5/2019 | Liu et al. |
| 2019/0303759 A1 | 10/2019 | Farabet et al. |
| 2019/0332875 A1 | 10/2019 | Vallespi-Gonzalez et al. |
| 2020/0148201 A1 | 5/2020 | King et al. |
| 2020/0174481 A1 | 6/2020 | Van Heukelom et al. |
| 2020/0180647 A1 | 6/2020 | Anthony |
| 2020/0216085 A1 | 7/2020 | Bobier-Tiu et al. |
| 2020/0225669 A1 | 7/2020 | Silva et al. |
| 2020/0283016 A1 | 9/2020 | Blaiotta |
| 2020/0324795 A1 | 10/2020 | Bojarski et al. |
| 2020/0380085 A1 | 12/2020 | Behrendt |
| 2020/0409368 A1 | 12/2020 | Caldwell et al. |
| 2020/0409378 A1 | 12/2020 | Benisch et al. |
| 2021/0114617 A1 | 4/2021 | Phillips et al. |
| 2021/0286924 A1 | 9/2021 | Wyrwas et al. |
| 2021/0341927 A1 | 11/2021 | Refaat |
| 2021/0347382 A1 | 11/2021 | Huang et al. |
| 2022/0153309 A1 | 5/2022 | Cui et al. |
| 2022/0153314 A1 | 5/2022 | Suo et al. |
| 2022/0161811 A1 | 5/2022 | Lu et al. |
| 2023/0121388 A1 | 4/2023 | Khan et al. |
| 2024/0101150 A1 | 3/2024 | Pronovost |
| 2024/0101157 A1 | 3/2024 | Pronovost |
| 2024/0104934 A1 | 3/2024 | Pronovost |
| 2024/0211731 A1 | 6/2024 | Pronovost |
| 2024/0211797 A1 | 6/2024 | Pronovost |
| 2024/0212360 A1 | 6/2024 | Pronovost |

OTHER PUBLICATIONS

Arsal Syed, Forecasting Pedestrian Trajectory Using Deep Learning, In: UNLV Theses, Dissertations, Professional Papers, and Capstones [online], 2021Y [retrieved on Mar. 11, 2024]. Retrieved from <URL: https://digitalscholarship.unlv.edu/theses dissertations/4269>pp. 2-49; table 2.1; and figures 1.2, 5.1, 67 pages.

Bruno Sauvalle et al., Autoencoder-based background reconstruction and foreground segmentation with background noise estimation [online], Jun. 27, 2022\Y [retrieved on Mar. 11, 2024]. Retrievedfrom<URL:https://www.researchgate.net/publication/357068811>4, 12pages 19-20, and tables 7-8.

The PCT Search Report and Written Opinion mailed Apr. 18, 2024 for PCT Application No. PCT/US2023/084618 from PCT Summary, 13 pages.

Hao Xue, Deep Learning Based Pedestrian Trajectory Prediction, In: Thesis—Doctor of Philosophy (research output) [online], 2020Y [retrieved on Mar. 11, 2024]. Retrieved from <URL: https://research-repository.uwa.edu.au/en/publications/deep-learning-based-pedestrian-trajectory-prediction>1-5,7-13pp. 3-109; and figure 6.4, 3 pages, 171 pages.

ICLR 2021 Conference Paper 2345 Authors, Official Comment on Latent Optimization Variational Autoencoder for Conditional Molecular Generation [online], Nov. 13, 2020 (last modification date)Y [retrieved on Mar. 11, 2024]. Retrieved from <URL: https://openreview.net/forum?id=BKIS2NCUro9¬eld=mvlj6-YW5kv>.

Balakrishnan, et al. "MultiPath++: Efficient Information Fusion and Trajectory Aggregation for Behavior Prediction" Submitted to Cornell University on Nov. 29, 2021; 22 pages.

Esser, "Taming Transformers for High-Resolution Image Synthesis" Submitted to Cornell University on Dec. 17, 2020; 52 pages.

Gilled, et al. "GOHOME: Graph-Oriented Heatmap Output for future Motion Estimation" submitted to Corness University on Sep. 4, 2021; 8 pages.

Giris, et al. "Latent Variable Sequential Set Transformers for Joint Multi-Agent Motion Prediction" ICLR 2022 Spotlight; Sep. 29, 2021; 26 pages.

Janjos, et al; "StarNet: Joint Action-Space Prediction with Star Graphs and Implicit Global Frame Self-Attention" Submitted to Corness University on Nov. 26, 2021; 7 pages.

Nglam, et al. "Scene Transformer: A unified architecture for predicting multiple agent trajectories" Published as a conference paper at ICLR 2022; Mar. 4, 2022, 25 pages.

Rhinehart, et al. "PRECOG: PREdiction Conditioned On Goals in Visual Multi-Agent Settings" Submitted to Cornell University on May 3, 2019; 24 pages.

Salzmann, et al. "Trajectron++: Dynamically-Feasible Trajectory Forecasting With Heterogeneous Data" Submitted to Cornell University on Jan. 9, 2020; 23 pages.

Tang, et al. "Multiple Futures Prediction" Submitted to Cornell University on Nov. 4, 2019; 17 pages.

Yang, et al; "TPPO A Novel Trajectory Predictor with Pseudo Oracle" IEEE Dec. 29, 2021; 14 pages.

ICLR 2021 Conference Paper 2345 Authors, Official Comment on Latent Optimization Variational Autoencoder for Conditional Molecular Generation [online], Nov. 13, 2020 (last modification date)Y [retrieved on Mar. 11, 2024]. Retrieved from <URL: https://openreview.net/forum?id=BKIS2NCUro9¬eld=mvlj6-YW5kv>; 11 pages.

Office Action for U.S. Appl. No. 17/855,671, Dated Jun. 21, 2024, 13 pages.

The PCT Search Report and Written Opinion mailed Apr. 29, 2024 for PCT Application No. PCT/US2023/084627 from PCT Summary, 11 pages.

Bruno Sauvalle et al., Autoencoder-based background reconstruction and foreground segmentation with background noise estimation [online], Jun. 27, 2022\Y [retrieved on Mar. 11, 2024]. Retrievedfrom<URL:https://www.researchgate.net/publication/357068811>4, 12pp. 19-20; and tables 7-8.

Office Action for U.S. Appl. No. 17/855,671, mailed on Dec. 4, 2024, Pronovost, "Conditional Trajectory Determination by a Machine Learned Model", 17 pages.

Office Action for U.S. Appl. No. 18/087,540, dated Dec. 4, 2024, 20 pages.

* cited by examiner

GENERATING A SCENARIO USING A VARIABLE AUTOENCODER CONDITIONED WITH A DIFFUSION MODEL

BACKGROUND

Machine learned models can be employed to predict an action for a variety of robotic devices. For instance, planning systems in autonomous and semi-autonomous vehicles determine actions for a vehicle to take in an operating environment. Actions for a vehicle may be determined based in part on avoiding objects present in the environment. For example, an action may be generated to yield to a pedestrian, to change a lane to avoid another vehicle in the road, or the like. Accurately predicting future object trajectories may be necessary to safely operate the vehicle in the vicinity of the object.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features.

DETAILED DESCRIPTION

Figure 1:
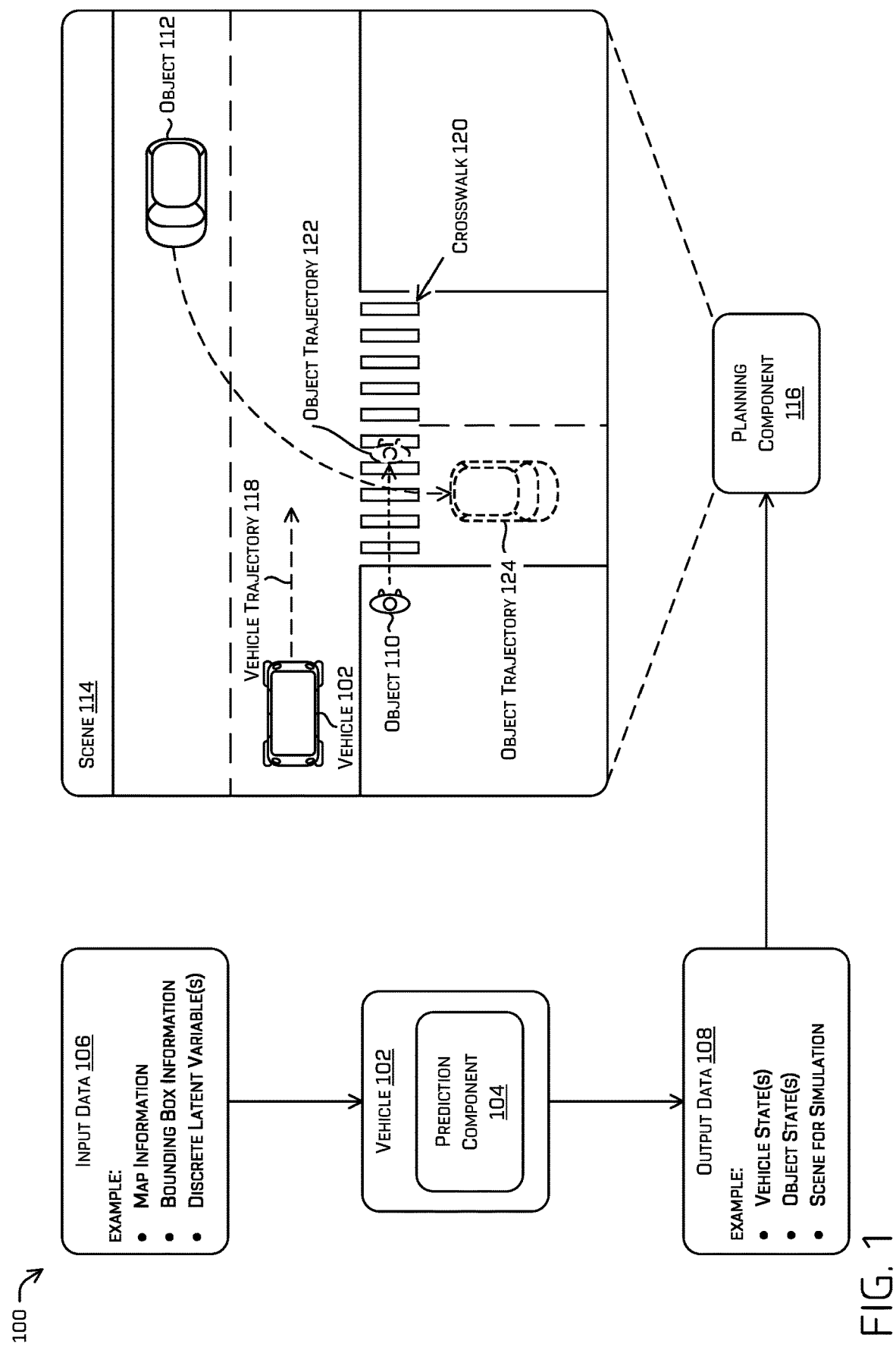
FIG. 1 is an illustration of an autonomous vehicle in an example environment, in which an example machine learned model may process input data to generate example output data.

This application describes techniques for applying and/or training one or more models to predict a representation of an object in an environment. For example, a computing device can implement a diffusion model to generate bounding box data or scene data usable for performing a simulation and/or for controlling an autonomous vehicle in the environment. The diffusion model can exchange data with a machine learned model (e.g., a decoder, a generator of a Generative Adversarial Network (GAN), a Graph Neural Network (GNN), a Recurrent Neural Network (RNN), a transformer model, etc.) to predict a position, a trajectory, or other state of one or more objects in the environment. In some examples, predictions associated with the diffusion model may be considered during vehicle planning operations associated with an autonomous vehicle to improve vehicle safety by planning for the possibility that an object may intersect with the vehicle.

In some examples, the computing device may perform a simulation using a variable autoencoder conditioned with a diffusion model. For example, a decoder of the variable autoencoder can receive latent variable data from the diffusion model (e.g., an action, intent, or attribute of an object) and output occupancy information for an object (e.g., a bounding box or a heat map to represent the object). The occupancy information can be input into a prediction component (e.g., a machine learned model) associated with a vehicle computing device of a vehicle. For example, the prediction component can output a predicted state for one or more objects proximate the vehicle and perform a simulation between the vehicle and the one or more objects. In various examples, the predicted state(s) for the one or more objects can be used as initial states in a simulation usable to identify a safe vehicle response to a potential action by an object (e.g., a vehicle trajectory that avoids the one or more objects in the environment).

In various examples, a machine learned model (e.g., a transformer model, a Graph Neural Network (GNN)) that may comprise one or more self-attention layers can process tokens or nodes representing an object action, an object state, etc. The self-attention layers (e.g., an operation that compares different entities represented in the input data one to another) can be used to represent potential object interactions (e.g., relative to the environment, relative to the autonomous vehicle, relative to another object, and so on). The machine learned model can, for example, generate an output by using the one or more self-attention layers to determine how a first object reacts to a second object in a simulation. For example, tokens output by the machine learned model can represent discrete latent variables (e.g., a latent embedding), or interactions between tokens. The discrete latent variables can, for example, be fed into a second machine learned model (e.g., a decoder, a generator of a Convolutional Neural Network (CNN), a Generative Adversarial Network (GAN), a GNN, a Recurrent Neural Network (RNN), another transformer model, etc.) as input data to determine a potential action or behavior of one or more objects in an environment (e.g., one or more of: a bounding box, an object trajectory, a heatmap showing a likelihood of occupancy by an object(s), object state data, or scene data usable in simulation, a scene of a sequence of simulations, to name a few). An output of the second machine learned model can be sent to the vehicle computing device for use in planning operations of a vehicle (e.g., to determine a candidate trajectory for the vehicle).

In some examples, the second machine learned model can generate a simulated environment that includes one or more object trajectories based at least in part on the output from the first machine learned model. In various examples, the second machine learned model can determine a response by the vehicle to the object trajectory in the simulated environment and control the vehicle in a real-world environment based at least in part on the response.

In some examples, a machine learned model (e.g., a diffusion model, a decoder, or other model) may receive map data and generate scene data that includes a top-down view of an environment based at least in part on map data. The top-down view can represent one or more of: an attribute (e.g., position, class, velocity, acceleration, yaw; turn signal status, etc.) of an object, history of the object (e.g., location history, velocity history, etc.), an attribute of the vehicle (e.g., velocity, position, etc.), crosswalk permission, traffic light permission, and the like. The data can be represented in a top-down view of the environment to capture context of the autonomous vehicle (e.g., identify actions of other vehicles and pedestrians relative to the vehicle). In some examples, the scene data can be represented by a graph, a vector representation, or other representation other than the top-down view of the environment.

In various examples, a vehicle computing device may be configured to determine actions to take while operating (e.g., trajectories to use to control the vehicle) based on predicted occupancy data, state data, scene data, etc. determined by one or more models. The actions may include a reference action (e.g., one of a group of maneuvers the vehicle is configured to perform in reaction to a dynamic operating environment) such as a right lane change, a left lane change, staying in a lane, going around an obstacle (e.g., double-parked vehicle, a group of pedestrians, etc.), or the like. The actions may additionally include sub-actions, such as speed variations (e.g., maintain velocity, accelerate, decelerate, etc.), positional variations (e.g., changing a position in a lane), or the like. For example, an action may include staying in a lane (action) and adjusting a position of the vehicle in the lane from a centered position to operating on a left side of the lane (sub-action).

For each applicable action and sub-action, the vehicle computing device may implement different model(s) and/or component(s) to simulate future states (e.g., estimated states) by projecting an autonomous vehicle and relevant object(s) forward in the environment for the period of time (e.g., 5 seconds, 8 seconds, 12 seconds, etc.). The model(s) may project the object(s) (e.g., estimate future positions of the object(s)) forward based on a predicted trajectory associated therewith. For instance, the model(s) may predict a trajectory of a vehicle and predict attributes about the vehicle including whether the trajectory will be used by the vehicle to arrive at a predicted location in the future. The vehicle computing device may project the vehicle (e.g., estimate future positions of the vehicle) forward based on the vehicle trajectories output by the model. The estimated state(s) may represent an estimated position (e.g., estimated location) of the autonomous vehicle and an estimated position of the relevant object(s) at a time in the future. In some examples, the vehicle computing device may determine relative data between the autonomous vehicle and the object(s) in the estimated state(s). In such examples, the relative data may include distances, locations, speeds, directions of travel, and/or other factors between the autonomous vehicle and the object. In various examples, the vehicle computing device may determine estimated states at a pre-determined rate (e.g., 10 Hertz, 20 Hertz, 50 Hertz, etc.). In at least one example, the estimated states may be performed at a rate of 10 Hertz (e.g., 80 estimated intents over an 8 second period of time).

In various examples, the vehicle computing device may store sensor data associated with an actual location of an object at the end of the set of estimated states (e.g., end of the period of time) and use this data as training data to train one or more models. For example, stored sensor data (or perception or prediction data derived therefrom) may be retrieved by a model and be used as input data to identify cues of an object (e.g., identify a feature, an attribute, or a pose of the object). Such training data may be determined based on manual annotation and/or by determining a change associated semantic information of the position of the object, via machine-learned labeling, etc. Further, detected positions over such a period of time associated with the object (e.g., from log data) may be used to determine a ground truth trajectory to associate with the object. In some examples, the vehicle computing device may provide the data to a remote computing device (i.e., computing device separate from vehicle computing device) for data analysis. In such examples, the remote computing device may analyze the sensor data to determine one or more labels for images, an actual location, yaw; speed, acceleration, direction of travel, or the like of the object at the end of the set of estimated states. In some such examples, ground truth data associated with one or more of: positions, trajectories, accelerations, directions, and so may be determined (either hand labelled or determined by another machine learned model) and such ground truth data may be used to determine a position or other states of one or more objects. In some examples, corresponding data may be input into the model to determine an output (e.g., a bounding box, scene data, and so on) and a difference between the determined output, and the actual position or action by the object (or actual scene data) may be used to train the model.

In some examples, the machine learned model may be configured to determine an initial position of each object in an environment (e.g., a physical area in which a vehicle operates and/or a simulated environment) indicated by the sensor data. The object states predicted by the models described herein may be based on passive prediction (e.g., independent of an action the vehicle and/or another object takes in the environment, substantially no reaction to the action of the vehicle and/or other objects, etc.), active prediction (e.g., based on a reaction to an action of the vehicle and/or another object in the environment), or a combination thereof.

As described herein, models may be representative of machine learned models, statistical models, heuristic models, or a combination thereof. That is, a model may refer to a machine learning model that learns from a training data set to improve accuracy of an output (e.g., a prediction). Additionally or alternatively, a model may refer to a statistical model that is representative of logic and/or mathematical functions that generate approximations which are usable to make predictions.

The techniques discussed herein may improve a functioning of a vehicle computing device in a number of ways. The vehicle computing device may determine an action for the autonomous vehicle to take based on an occupancy representation of an object determined by a decoder conditioned by a diffusion model. In some examples, using the techniques described herein, the decoder (or other model) may output bounding boxes for objects and accurately predict motion of the objects with greater detail as compared to previous models thereby improving safety of the vehicle.

The techniques discussed herein can also improve a functioning of a computing device in a number of additional ways. In some cases, one or more models can determine a bounding box for an object, state information for the object, and/or a scene for simulation using fewer computational resources as previous models. In some examples, one or more models can generate a scene that is not included in the input data to the model(s) (e.g., generate a realistic scene from data other than scene data), and use the scene for training and/or validation of a vehicle controller associated with an autonomous vehicle. For example, conditioning a variable autoencoder using a diffusion model can generate discrete object data and/or scene data using fewer processing and/or memory resources (relative to not implementing the diffusion model), which may simplify the generation of predictions and subsequent generation of at least one predicted trajectory. In some cases, evaluating an output by a model(s) may allow an autonomous vehicle to generate more accurate and/or safer trajectories for the autonomous vehicle to traverse an environment. These and other improvements to the functioning of the computing device are discussed herein.

In some examples, the determination techniques discussed herein may reduce training time by training in parallel and/or improve accuracy by reducing an amount of data to be stored. Further, such techniques provide for training networks based on larger datasets than would otherwise not be enabled due to, for example, limitations of memory, processing power, etc. (thereby creating more robust learned networks in shorter amounts of time).

The methods, apparatuses, and systems described herein can be implemented in a number of ways. Example implementations are provided below with reference to the following figures. Although discussed in the context of an autonomous vehicle in some examples below, the methods, apparatuses, and systems described herein can be applied to a variety of systems. In one example, machine learned models may be utilized in driver-controlled vehicles in which such a system may provide an indication of whether it is safe to perform various maneuvers. In another example, the methods, apparatuses, and systems can be utilized in an aviation or nautical context. Additionally, or alternatively, the techniques described herein can be used with real data (e.g., captured using sensor(s)), simulated data (e.g., generated by a simulator), or any combination thereof.

FIG. 1 illustrates an autonomous vehicle (vehicle 102) in an example environment 100, in which an example machine learned model (prediction component 104) may process input data (input data 106) to generate example output data (output data 108) representing a scene and/or predict state data associated with an autonomous vehicle and/or an object in the environment 100. In some examples, the techniques described herein may be implemented at least partially by or in association with a vehicle computing device (e.g., vehicle computing device(s) 704) and/or a remote computing device (e.g., computing device(s) 734).

As illustrated, the vehicle 102 includes the prediction component 104 that represents one or more machine learned models for processing various types of input data 106 (e.g., map data, bounding box(es), discrete latent variable data). The prediction component 104 can, for example, determine output data 108 representing a state of the vehicle 102, a state of various objects proximate the vehicle including an object 110 and an object 112, and/or scene data 114 usable for simulation. In various examples, the prediction component 104 can transmit the output data 108 to a planning component 116 for use during planning operations. For example, the planning component 116 can determine a vehicle trajectory 118 for the scene 114.

In various examples, a vehicle computing device associated with the vehicle 102 may be configured to detect one or more objects (e.g., objects 110 and 112) in the environment 100, such as via a perception component. In some examples, the vehicle computing device may detect the objects, based on sensor data received from one or more sensors. In some examples, the sensors may include sensors mounted on the vehicle 102, and include, without limitation, ultrasonic sensors, radar sensors, light detection and ranging (lidar) sensors, cameras, microphones, inertial sensors (e.g., inertial measurement units, accelerometers, gyros, etc.), global positioning satellite (GPS) sensors, and the like. In various examples, the vehicle 102 may be configured to transmit and/or receive data from other autonomous vehicles, remote sensors, and/or the sensors. The data may include sensor data, such as data regarding the objects detected in the environment 100.

In various examples, the vehicle computing device can receive the sensor data and can semantically classify the detected objects (e.g., determine an object type), such as, for example, whether the object is a pedestrian, such as object 110, a vehicle such as object 112, a building, a truck, a motorcycle, a moped, or the like. The objects may include static objects (e.g., buildings, bridges, signs, etc.) and dynamic objects such as other vehicles, pedestrians, bicyclists, or the like. In some examples, a classification may include another vehicle (e.g., a car, a pick-up truck, a semi-trailer truck, a tractor, a bus, a train, etc.), a pedestrian, a child, a bicyclist, a skateboarder, an equestrian, an animal, or the like. In various examples, the classification of the object may be used by a model to determine object characteristics (e.g., maximum speed, acceleration, maneuverability, etc.). In this way, potential trajectories by an object may be considered based on characteristics of the object (e.g., how the object may potentially move in the environment). As depicted in FIG. 1, the example environment 100 includes a crosswalk 120.

The planning component 116 provides functionality to determine an object trajectory 122 associated with the pedestrian 110, and determine an object trajectory 124 associated with the vehicle 112. The prediction component 104 can predict the scene 118 for use in simulation by the planning component 116. For instance, the prediction component 104 can output one or more scenes usable in a simulation (also referred to as a scenario or estimated states) performed by the planning component 116 to determine a response by the vehicle 102 to a simulated object.

In some examples, the prediction component 104 can represent one or more machine learned models which can vary depending upon which output data is being determined. For example, a decoder can receive map data (e.g., a roadway, a crosswalk, a building, etc.) and discrete latent variables (e.g., values representing an attribute or state of an environment, an object, or a vehicle in a latent space) as input and output object states for multiple objects in an environment. In another example, the prediction component 104 can represent a diffusion model that is configured to output scene data based at least in part on receiving map data as input. The prediction component 104 may, in various examples, represent a generative machine learned model that is configured to receive (e.g., from a decoder of a variable autoencoder) occupancy information such as a point, contour, or bounding box associated with an object as the input data 106, and generate one or more scenes for use in a) a simulation between a vehicle and one or more objects proximate the vehicle, or b) a planning operation associated with a planning component.

In some examples, the input data 106 can include sensor data from one or more sensors, log data, token information from a transformer model, node information from a GNN, and so on. The log data can identify objects associated with different areas of the environment 100 at a previous time. The token information and/or node information can represent discrete latent variables associated with one or more objects. A token can, for instance, represent how the object can move in the environment 100 at a future time (e.g., in the scene 114). For example, a token can represent a high-level behavior of an object or the vehicle such as a direction of travel, an indication to turn, stop, or accelerate, to name a few. In a nonlimiting example, a first token can represent a vehicle traveling in a first direction at a particular velocity and a second token can represent an object facing a second direction and not moving. A token may also or instead represent a stop sign, crosswalk, a roadway, or other environmental feature.

In some examples, the input data 106 can represent discrete latent variable data from a diffusion model, and the prediction component 104 can represent a decoder that is configured to generate object state(s) and/or vehicle state(s) that are usable as initial states during simulation. Additional details regarding using multiple machine learned models to determine example output data can be found in FIGS. 2 and 3, and elsewhere.

The prediction component 104 can be included in a vehicle computing device that is configured to control the vehicle 102 in the environment 100. The output data 108 from the prediction component 104 can be used by the vehicle computing device in a variety of ways. For instance, information about the state data and/or the scene data can be used by a planning component of the vehicle computing device to control the vehicle 102 in the environment 100 (e.g., determine a vehicle trajectory 118 and/or control a propulsion system, a braking system, or a steering system). The output data 108 may also or instead be used to perform a simulation by setting up conditions (e.g., an intersection, a number of objects, a likelihood for the object to exhibit abnormal behavior, etc.) for use during the simulation.

A training component associated with the computing device(s) 734 (not shown) and/or the vehicle computing device(s) 704 (not shown) may be implemented to train the prediction component 104. Training data may include a wide variety of data, such as sensor data, map data, bounding box data, real-world or labelled scenes, etc., that is associated with a value (e.g., a desired classification, inference, prediction, etc.). In some examples training data can comprise determinations based on sensor data, such as a bounding boxes (e.g., two-dimensional and/or three-dimensional bounding boxes associated with an object), segmentation information, classification information, an object trajectory, and the like. Such training data may generally be referred to as a "ground truth." To illustrate, the training data may be used for generating scenes with objects having discrete information based on outputs from one or more models (e.g. a diffusion model, a variable autoencoder, a transformer model, a GNN, or a combination thereof).

Figure 2:
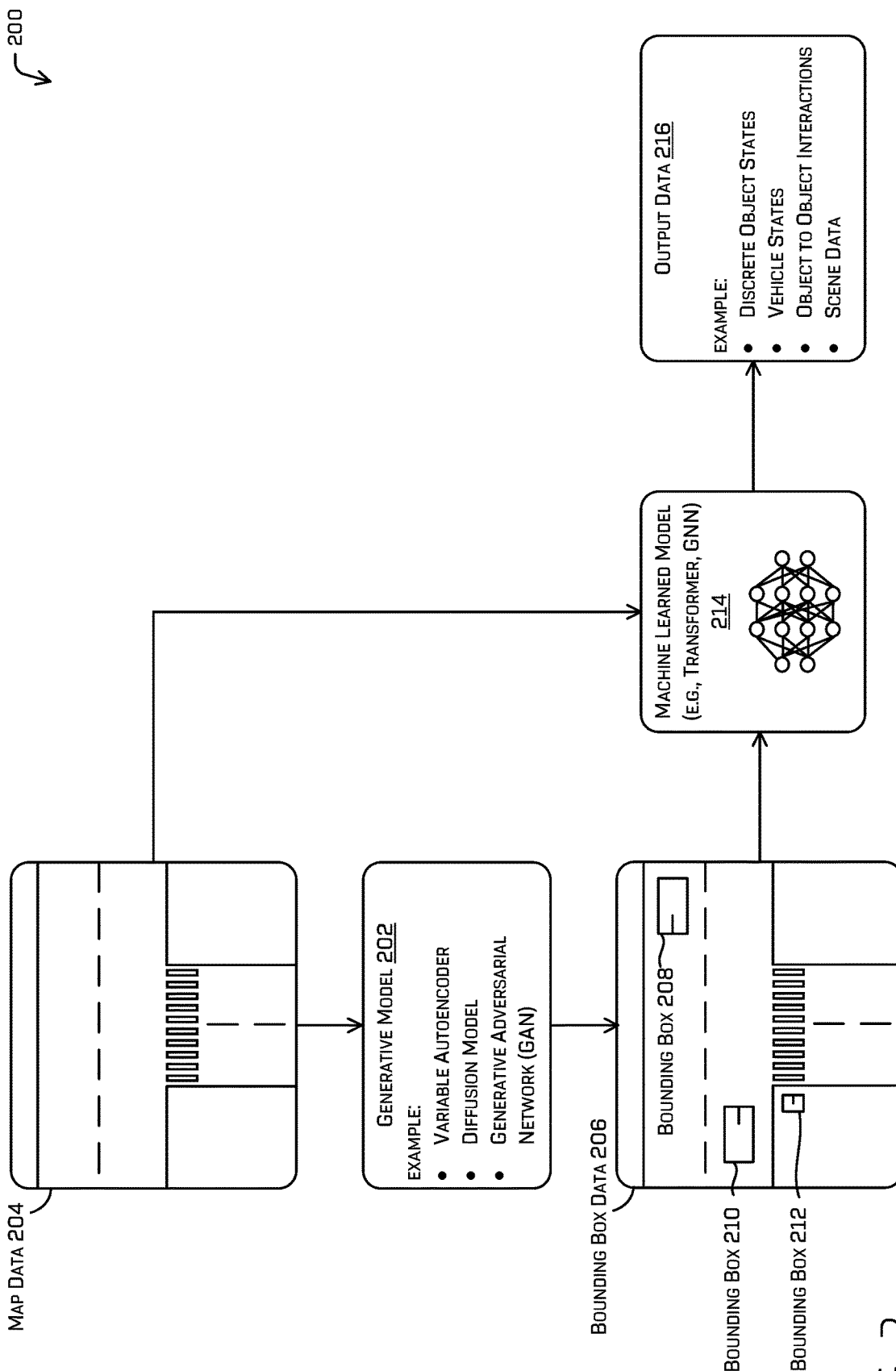
FIG. 2 illustrates an example block diagram of an example computer architecture for implementing techniques to generate example output data, as described herein.

FIG. 2 illustrates an example block diagram 200 of an example computer architecture for implementing techniques to generate example output data as described herein. The example 200 includes a computing device (e.g., the vehicle computing device(s) 704 and/or the computing device(s) 734) that includes a generative model 202. In some examples, the generative model 202 can include at least the functionality of the prediction component 104 in FIG. 1. The techniques described in FIG. 2 can be associated with the vehicle 102 such as when the vehicle navigates in a real-world environment or a simulated environment.

As illustrated, the generative model 202 (e.g., a variable autoencoder, a diffusion model, a GAN, or other generative machine learned model) can receive map data 204 associated with an environment and output bounding box data 206 for one or more objects in the environment. The generative model can represent a machine learned model that samples first data from a data set and also samples second data (e.g., condition data) from a source other than the data set, and uses the first data and the second data to generate an output. In some examples, the generative model 202 can represent a decoder of a variable autoencoder that receives map data 204 and generates the bounding box data 206 that includes a bounding box 208, a bounding box 210, and a bounding box 212. Each of the bounding boxes 208, 210, and 212 can represent occupancy of a respective object and can include an orientation as shown in FIG. 2 by a line at one end of the bounding box. The generative model 202 can generate the bounding box data 206 based on the map data 204 and independent of receiving object position data as input. Instead, the generative model 202 is trained to output objects at various locations in an environment given map data representing an intersection, a roadway, a sidewalk, a crosswalk, a building or other static object, traffic law information (e.g., traffic signs, speed limits, etc.), and so on. In some examples, the generative model 202 can represent a decoder that is trained to determine the bounding box data 206 based on the map data 204. In such examples, the decoder can be conditioned using a diffusion model that provides latent variable data associated with an object to the decoder, further detail of which is discussed elsewhere including in FIG. 3.

In some examples, a decoder of the variable autoencoder may receive map data representing a top-down view of an environment. For instance, the map data 204 can be associated with a first number of channels while an output of the decoder (e.g., the bounding box data 206, scene data, etc.) can be associated with a second number of channels different from the first number of channels. In some examples, the map data can represent top-down multi-channel data indicative of a top-down representation of an environment (e.g., wherein each channel or layer comprises data about the scene). The top-down representation may be determined based at least in part on map data and/or sensor data (e.g., lidar data, radar data, image data, etc.) captured from or associated with a sensor of an autonomous vehicle in the environment, and may represent a top-down view of the environment to capture context of the autonomous vehicle (e.g., identify actions of other objects such as vehicles and pedestrians relative to the vehicle). In some examples, such channels may represent, for example, occupancy, speed, lane indications, speed limits, traffic control, object type, etc. The top-down representation can include a channel(s) to represent one or more of: an attribute (e.g., position, class, velocity, acceleration, yaw, turn signal status, etc.) of an object, history of the object (e.g., location history, velocity history, etc.), an attribute of the vehicle (e.g., velocity, position, etc.), crosswalk permission, traffic light permission, and the like. Thus, the output by the decoder can include more channels (e.g., more state data or other information) than the number of channels associated with the map data 204.

While FIG. 2 depicts the generative model 202 outputting the bounding box data 206, in some examples the generative model 202 can, additionally or alternatively, output a vector representation of the object(s). In some examples, the vector representation can be determined by a Graph Neural Network which is a type of neural network which operates on a graph structure. Machine-learning based inference operations may be performed to update the state of the graph neural network, including updating nodes and/or edge features, based on internal inputs determined from the graph neural network itself and/or based on updated observations perceived by the autonomous vehicle in the environment. In some examples, the generative model 202 can output the bounding box data 206 and a vector indicating a trajectory for an object associated with a corresponding bounding box. The vector can represent an object trajectory over time such that each bounding box can include a vector having different points along its length to represent a location of the object in the environment at different times in the future.

The vector representation may, in some examples, be determined based on a polyline (e.g., a set of line segments) representing one or more map elements. For instance, the Graph Neural Network can encode and aggregate the polyline into a node data structure representing with the map element(s). For example, an object or feature of the environment can be represented by polylines (e.g., a lane can be segmented into a number of smaller line segments whose length, location, orientation angle (e.g., yaw), and directionality, when aggregated, define the lane). Similarly, a crosswalk (or other feature of the environment) may be defined by four connected line segments, and a roadway edge or roadway centerline may be multiple connected line segments.

In various examples, the bounding box data 206 can be sent to a machine learned model 214 which can also receive the map data 204 as input. The machine learned model 214 can represent a transformer model, a GNN, or other machine learned model that is configured to determine output data 216 representing discrete object states for the object(s), vehicle states for the vehicle 102, and/or scene data for performing a simulation between the vehicle 102 and the object(s). For example, the output data 216 can represent state data including one or more of: position data, orientation data, heading data, velocity data, speed data, acceleration data, yaw rate data, or turning rate data associated with the object and/or the vehicle.

In examples when the machine learned model 214 represents a transformer model, tokens can represent object behavior, vehicle behavior, and/or environment features. For example, a first token can represent an object state for a first object, a second token can represent an object state for second object, a third token can represent a vehicle state, and a fourth token can represent environment features (e.g., a traffic signals, crosswalk, weather, etc.). The object state can indicate a position, orientation, velocity, acceleration, yaw; etc. of an object. A token may also or instead indicate an action by the object and/or the vehicle (e.g., go straight, turn right, turn left, etc.). In some examples, the tokens can represent discrete latent variables that enable the machine learned model 214 to sample tokens that represent potential interactions between a first object relative to a second object without relying on continuous distribution techniques (e.g., a Gaussian distribution) thereby saving computational resources.

In some examples, a first token can represent a characteristic (e.g., a state or an action) such as one of: a yield action, a drive straight action, a left turn action, a right turn action, a brake action, an acceleration action, a steering action, or a lane change action, and a second token can represents a position of the object. An additional token can represent an action or state associated with the vehicle 102. Thus, the tokens can represent potential interactions between two or more objects relative to the vehicle.

Figure 3:
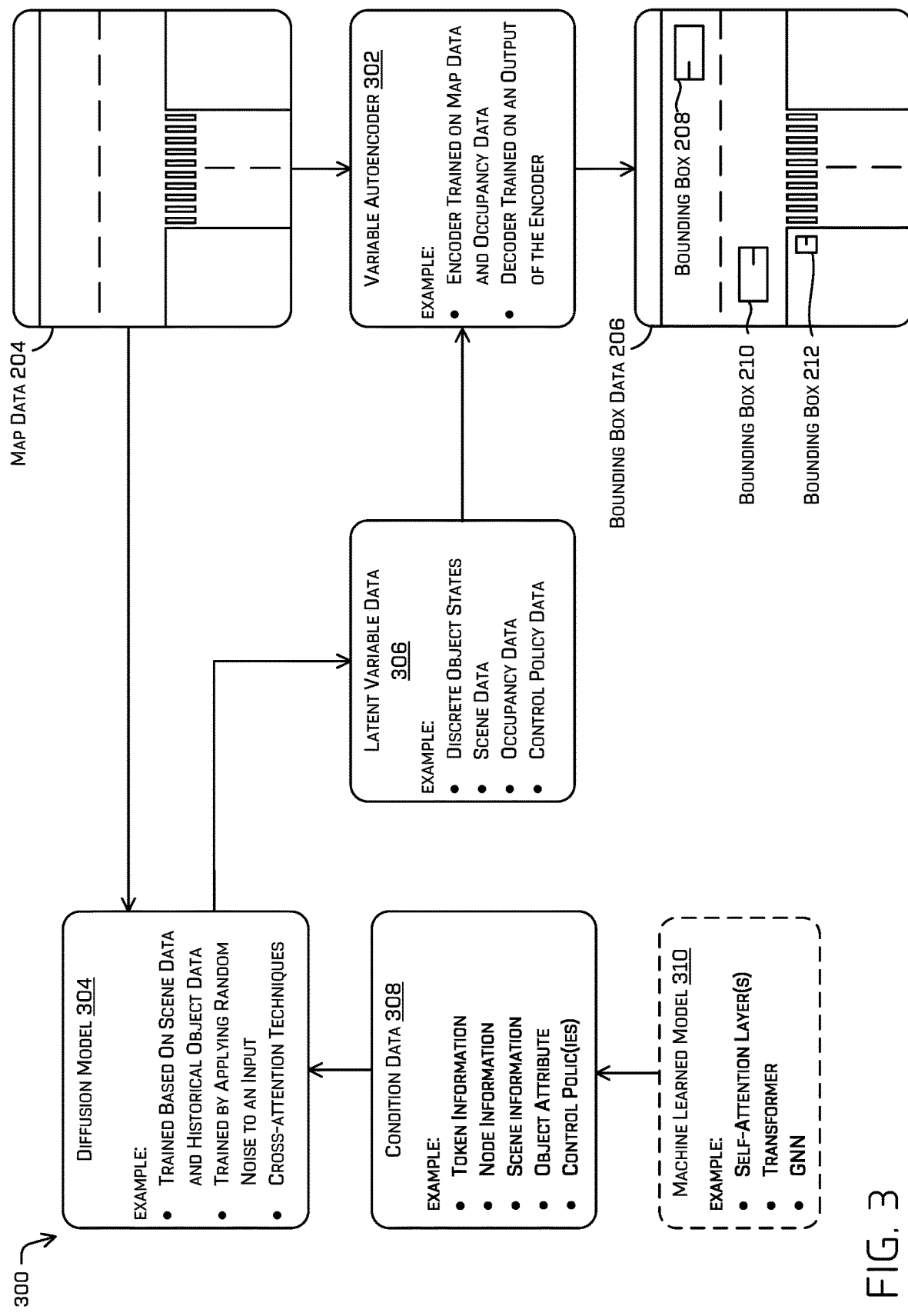
FIG. 3 illustrates another block diagram of an example computer architecture for implementing techniques to generate example output data, as described herein.

FIG. 3 illustrates an example block diagram 300 of an example computer architecture for implementing techniques to generate example output data as described herein. The example 300 includes a computing device (e.g., the vehicle computing device(s) 704 and/or the computing device(s) 734) that implements a variable autoencoder 302 and a diffusion model 304. In some examples, the techniques described in relation to FIG. 3 can be performed as the vehicle 102 navigates in the environment 100 (e.g., a real-world environment or a simulated environment).

The variable autoencoder 302 includes an encoder and a decoder to provide a variety of functionality including generating occupancy information for one or more objects (e.g., the bounding box data 206, a heatmap). The encoder and/or the decoder can represent a machine learned model such as a CNN, a GNN, a GAN, an RNN, a transformer model, and the like. As discussed elsewhere herein, the encoder can be trained based at least in part on map data and occupancy data. The occupancy data can indicate an area of the environment in which objects are likely to be located. The decoder can be trained based at least in part on a loss between the output of the decoder and an output of the encoder. In some examples, the decoder can be trained to improve a loss that takes into consideration the latent variable data 306 from the diffusion model 304.

In various examples, the decoder of the variable autoencoder 302 can receive the map data 204 of FIG. 2 and latent variable data 306 associated with one or more objects from the diffusion model 304. The diffusion model 304 can represent a machine learned model that implements a diffusion process to add and/or remove noise from an input. For instance, the diffusion model 304 can incrementally denoise data to generate an output based on a conditional input. In some examples, the diffusion model 304 can denoise the map data 204 (and/or other input data) to output latent variables (e.g., the latent variable data 306) associated with an object. The diffusion model 304 can output the latent variable data 306 representing a behavior (e.g., a state or intent) of one or more objects. Further discussion of an example diffusion model is discussed in relation to FIG. 5, and elsewhere.

In various examples, the diffusion model 304 can determine the latent variable data 306 based at least in part on conditioning the input data (e.g., adding or removing noise from the input data) using the condition data 308. In some examples, the diffusion model 304 can condition the input data based at least in part on one or more of: token information from a transformer model, node information from a GNN, scene information or other historical data. Token information can represent one or more tokens associated with objects in an environment including, in some examples, a token for an autonomous vehicle, a token to represent scene conditions, etc. Node information can include a node of a Graph network associated with an object. Nodes or tokens of different objects can be used to condition the diffusion model 304 so that the latent variable data 306 represents different object states (e.g., a position, a trajectory, an orientation, and the like).

In some examples, the diffusion model 304 can employ cross-attention techniques to determine a relationship between a vehicle and an object, a first object and a second object, and so on. The diffusion model 304 can, for example, output the latent variable data 306 based at least in part on applying one or more cross attention algorithms to the condition data 308. As mentioned, the diffusion model 304 can receive the condition data 308 (or values thereof) independent of receiving data directly from the machine learned model 310.

In some examples, the condition data 308 can represent one or more of: an attribute (e.g., previous, current, or predicted position, velocity, acceleration, yaw, etc.) of the one or more objects, history of the object(s) (e.g., location history, velocity history, etc.), an attribute of the vehicle (e.g., velocity, position, etc.), and/or features of the environment (e.g., roadway boundary, roadway centerline, crosswalk permission, traffic light permission, and the like). For example, the condition data 308 can include historical state data associated with an object (e.g., the pedestrian 110, the vehicle 112 in FIG. 1) and/or a vehicle (e.g., vehicle 102) in an environment, such as in example environment 100. As mentioned, the state data can include, in various examples, one or more of position data, orientation data, heading data, velocity data, speed data, acceleration data, yaw rate data, or turning rate data associated with the object and/or the vehicle. In some examples, the condition data 308 can represent one or more control policies for use during a simulation (e.g., to associate with the scene data).

In various examples, a machine learned model 310 can output the condition data 308 for sending to the diffusion model 304. The machine learned model 310 can, for example, include one or more self-attention layers for determining "attention" or a relation between a first object and a second object (also referred to herein as cross attention data). In some examples, the machine learned model 310 can be a transformer model or a GNN configured to generate cross attention data between two or more objects in an environment, but other machine learned model types are also contemplated.

In some examples, the condition data 308 can include a scalar value to represent the text data (or other condition data) that is not necessarily output by a machine learned model. Hence, the machine learned model 310 is shown in FIG. 3 having dashed lines to indicate that the machine learned model 310 may not be used in all examples.

Figure 4:
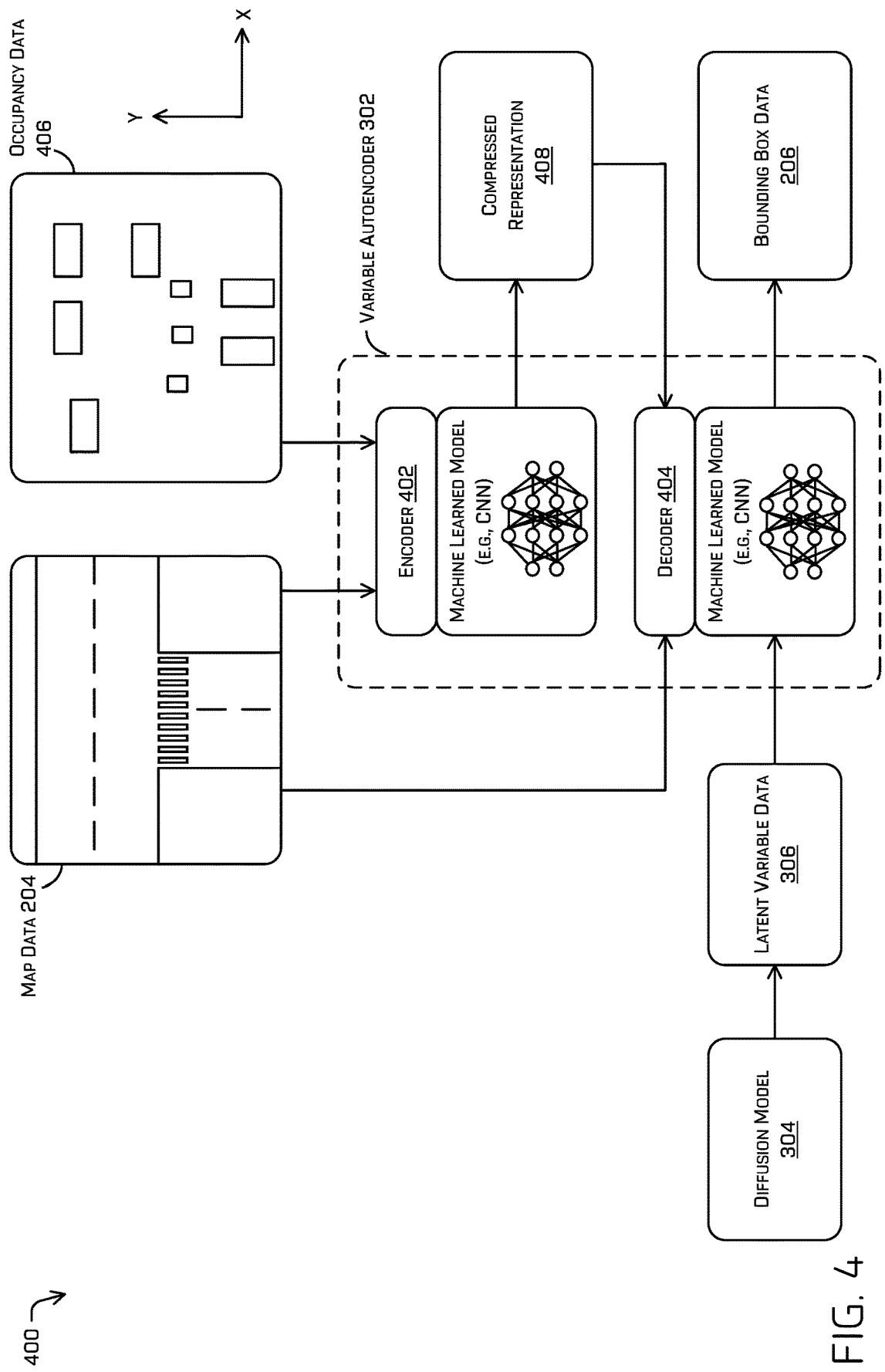
FIG. 4 illustrates an example block diagram of an example variable autoencoder implemented by a computing device to generate example output data, as described herein.

In some examples, the scene information associated with the condition data 308 can include the map data 204 and, in such examples, the variable autoencoder 302 can receive another type of input data other than the map data 204 as input, such as occupancy data, as further discussed in FIG. 4 and elsewhere.

FIG. 4 illustrates an example block diagram 400 of an example variable autoencoder implemented by a computing device to generate example output data, as described herein. The techniques described in the example 400 may be performed by a computing device such as the vehicle computing device(s) 704 and/or the computing device(s) 734.

As depicted in FIG. 4, the variable autoencoder 302 of FIG. 3 comprising an encoder 402 and a decoder 404 that can be trained independently to output object occupancy information (e.g., a bounding box, heatmap) and/or object attribute information (e.g., an object state, an object type, etc.). For instance, the encoder 402 of the variable autoencoder 302 can receive, as input data, the map data 204 representing an environment and occupancy data 406 associated with one or more objects in the environment. The encoder 402 can output a compressed representation 408 of the input data which represents a latent embedding. In various examples, the decoder 404 can receive the output data from the encoder and/or the latent variable data 306 from the diffusion model 304 (e.g., latent variable data can represent an action, intent, or attribute of an object for use in a simulation). In some examples, the decoder 404 may receive a compressed version of the map data 204 and/or a compressed version of the occupancy data 406 as input in examples that does not include the encoder 402 (e.g., independent of receiving the compressed input from an encoder). For example, the decoder 404 can output the bounding box data 206 by receiving compressed input data from a source other than the encoder 402.

In some examples, the encoder 402 and/or the decoder 404 can represent a machine learned model such as a CNN, a GNN, a GAN, an RNN, a transformer model, and the like. As discussed elsewhere herein, the encoder 402 can be trained based at least in part on the map data 204 and the occupancy data 406. In some examples, the map data 204 and/or the occupancy data 406 can represent a top-down view of the environment (as indicated by the x and y axes). In some examples, the encoder 402 can receive one of the map data 204 and/or the occupancy data 406 as input. For example, the encoder 402 can receive the occupancy data 406 as input and the decoder 404 can receive a compressed version of the occupancy data 406 as input (not shown).

The occupancy data 406 can indicate an area of the environment in which objects are likely to be located. For example, the occupancy data is associated with occupancy of an object whereas the bounding box data 206 can include object information (a speed of the object, an acceleration of the object, a yaw of the object, etc.). The decoder 404 can be trained based at least in part on a loss between the output by the decoder 404 and the compressed representation 408 output by the encoder 402. In some examples, the decoder 404 can be trained to improve a loss that takes into consideration the latent variable data 306 from the diffusion model 304.

The compressed representation 408 of the input data can represent a latent embedding (e.g., a representation of the input data in latent space). By determining the compressed representation 408 fewer computational resources are required for subsequent processing versus not compressing the input data.

Figure 5:
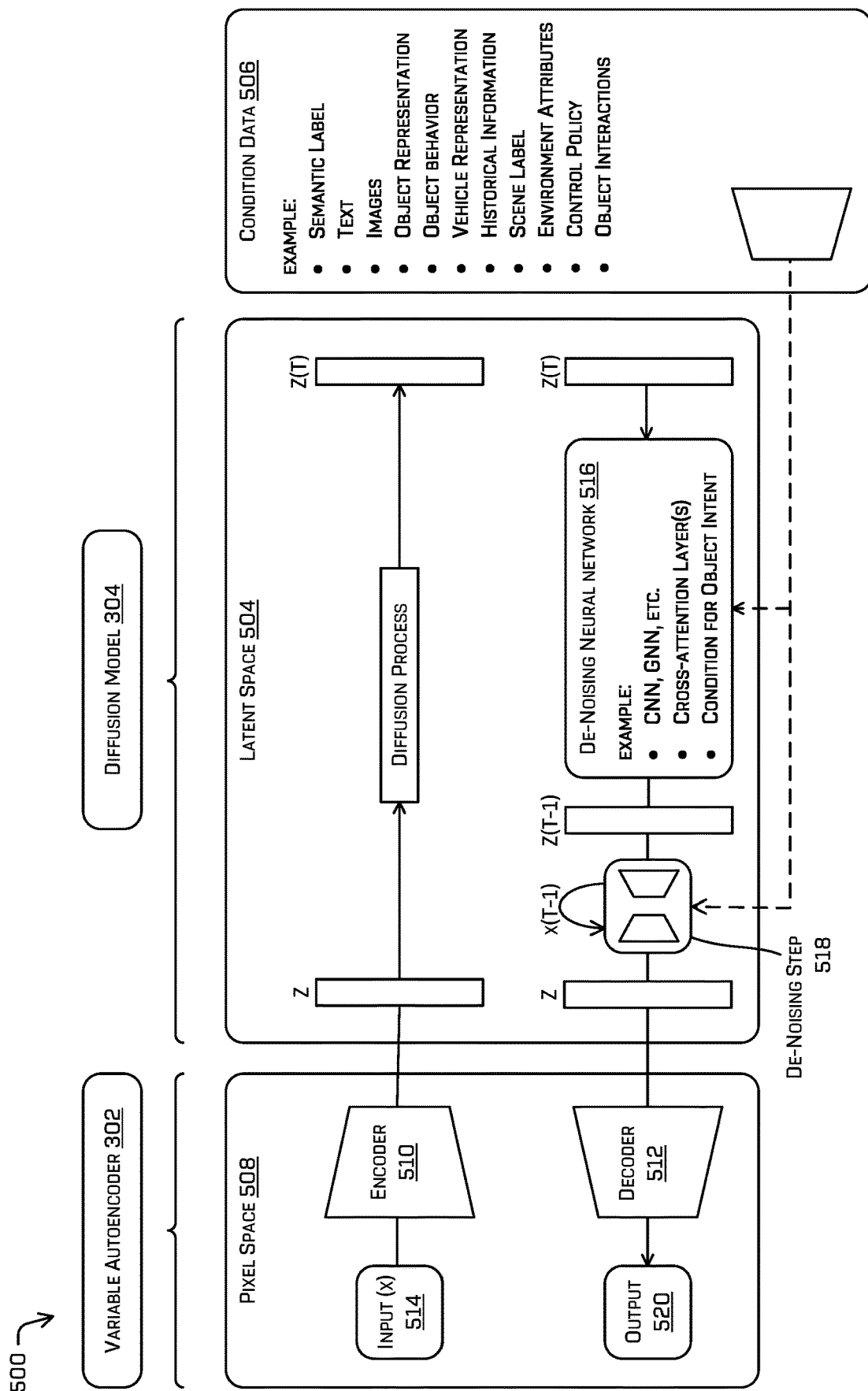
FIG. 5 illustrates an example block diagram of an example diffusion model, as described herein.

FIG. 5 illustrates an example block diagram 500 of an example diffusion model implemented by a computing device to generate example output data, as described herein. The techniques described in the example 500 may be performed by a computing device such as the vehicle computing device(s) 704 and/or the computing device(s) 734.

For example, the computing device can implement the diffusion model 304 of FIG. 3 to generate the latent variable data 306 for use by a machine learned model such as the variable autoencoder 302. The diffusion model 304 comprises latent space 504 for performing various steps (also referred to as operations) including adding noise to input data during training (shown as part of the "diffusion process" in FIG. 5) and/or removing noise from input data during non-training operations. The diffusion model 304 can receive condition data 506 for use during different diffusion steps to condition the input data, as discussed herein. For example, the condition data 506 can represent one or more of: a semantic label, text, an image, an object representation, an object behavior, a vehicle representation, historical information associated with an object and/or the vehicle, a scene label indicating a level of difficulty to associate with a simulation, an environment attribute, a control policy, or object interactions, to name a few.

In some examples, the condition data 506 can include a semantic label such as token information, node information, and the like. The condition data 506 can include, for example, text or an image describing an object, a scene, and/or a vehicle. In some examples, the condition data 506 can be a representation and/or a behavior associated with one or more objects in an environment. The condition data 506 may also or instead represent environmental attributes such as weather conditions, traffic laws, time of day, or data describing an object such as whether another vehicle is using a blinker or a pedestrian is looking towards the autonomous vehicle. In some examples, the condition data 506 represents one or more control policies that control a simulation (or object interactions thereof). In one non-limiting example, the condition data 506 can include specifying an object behavior, such as a level of aggression for a simulation that includes an autonomous vehicle.

FIG. 5 depicts the variable autoencoder 302 associated with pixel space 508 that includes an encoder 510 and a decoder 512. In some examples, the encoder 510 and the decoder 512 can represent an RNN or a multilayer perceptron (MLP). In some examples, the encoder 510 can receive an input (x) 514 (e.g., an object trajectory, map data, object state data, or other input data), and output embedded information Z in the latent space 504. In some examples, the embedded information Z can include a feature vector for each object to represent a trajectory, a pose, an attribute, a past trajectory, etc. In some examples, the input (x) 514 can represent a top-down representation of an environment including a number of objects (e.g., can be determined by the condition data 506). In some examples, the input (x) 514 can represent the input data 302 of FIG. 3.

During training, the "diffusion process" can include applying an algorithm to apply noise to the embedded information Z to output a noisy latent embedding Z(T). When implementing the diffusion model 304 after training, the noisy latent embedding Z(T) (e.g., a representation of the input (x) 514) can be input into a de-noising neural network 516. The diffusion model 304 can initialize the noisy latent embedding Z(T) with random noise, and the de-noising neural network 516 (e.g., a CNN, a GNN, etc.) can apply one or more algorithms to determine an object intent based on applying different noise for different passes, or steps, to generate latent variable data that represents an object intent in the future. In some examples, multiple objects and object intents can be considered during denoising operations.

By way of example and not limitation, input to the de-noising neural network 516 can include a graph of nodes in which at least some nodes represent respective objects. In such examples, the input data can be generated with random features for each object, and the de-noising neural network 516 can include performing graph message passing operations for one or more diffusion steps. In this way, the de-noising neural network 516 can determine an object intent (e.g., a position, a trajectory, an orientation, etc.) for an object with consideration to the intent of other objects. By performing multiple diffusion steps, potential interactions between objects can change over time to best reflect how a diverse set of objects may behave in a real-world environment.

The condition data 506 can be used by the diffusion model 304 in a variety of ways including being concatenated with the noisy latent embedding Z(T) as input into the de-noising neural network 516. In some examples, the condition data 506 can be input during a de-noising step 518 applied to an output of the de-noising neural network 516. The de-noising step 518 represents steps to apply the condition data 506 over time to generate the embedded information Z which can be output to the decoder 512 for use as initial states in a simulation that determines an output 520 representative of an object trajectory, or another predicted object state(s).

A training component (not shown) can train the diffusion model 304 based at least in part on a computed loss for the decoder 512 (e.g., the ability for the decoder to produce an output that is similar to the input to the encoder). That is, the diffusion model can improve predictions over time based on being trained at least in part on a loss associated with the decoder 512. In some examples, the decoder 512 can be trained based at least in part on a loss associated with the diffusion model 304.

Figure 6:
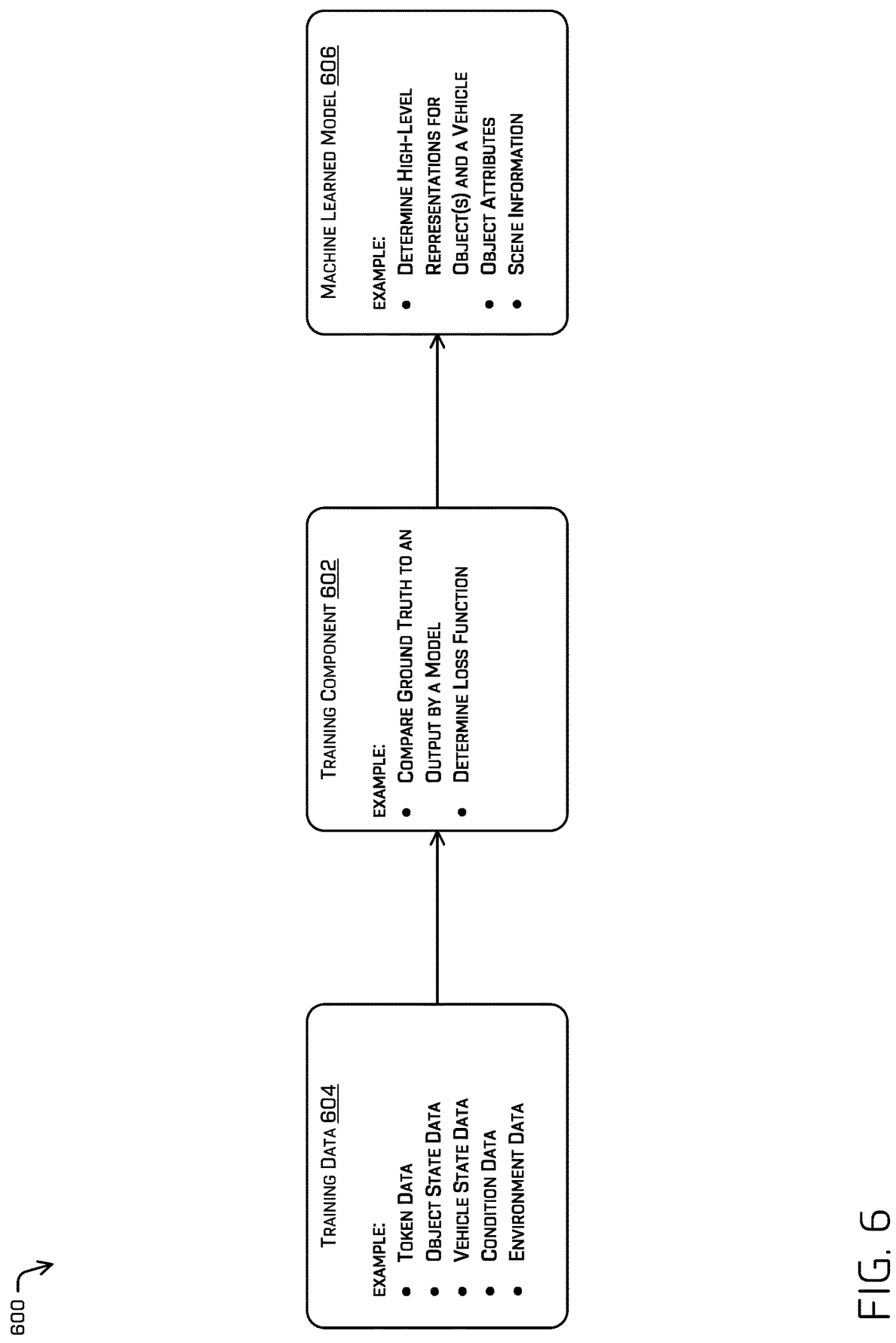
FIG. 6 depicts an example block diagram of an example training component implemented by a computing device to train an example machine learned model.

FIG. 6 depicts an example block diagram 600 of an example training component implemented by a computing device to train an example machine learned model. For example, the computing device (e.g., the vehicle computing device(s) 704 and/or the computing device(s) 734) can implement the training component 602 to process training data 604 and output a machine learned model 606 that determines high-level representations for one or more objects and/or a vehicle (the vehicle 102 or the vehicle 602).

In some examples, the training component 602 can process the training data 604 to output occupancy data (e.g., a bounding box(es), a heatmap(s), etc.), state data, or scene data, depending on the machine learned model being trained. In some examples, the machine learned model 606 can represent the predictive model 104, the generative model 202, the machine learned model 214, the diffusion model 304, the machine learned model 310, the encoder 402, or the decoder 404. By training the machine learned model 606 as described herein, determinations by the machine learned model 606 provide more accurate depictions of potential interactions between the vehicle and the object(s) in an environment.

In various examples, the training component 602 can process the training data 604 (e.g., token data, object state data, vehicle state data, discrete latent variables, condition data, environment data, etc.) to determine discrete data for one or more objects. In some examples, the training data 604 can represent ground truth data, and the training component 602 can compare the ground truth data to an output by the machine learned model 606 (e.g., a bounding box or other occupancy representation, an action or intent by the object, state data associated with an object and/or the vehicle, scene data) as part of backpropagation. The machine learned model 606 can be trained to minimize loss associated with the output and maximize accuracy of the output to represent different scenarios with different objects.

As mentioned, the training data 604 can include token data (e.g., a first token represents one of: a yield action, a drive straight action, a left turn action, a right turn action, a brake action, an acceleration action, a steering action, or a lane change action, and a second token represents a position, a heading, or an acceleration of the object), object state data associated with one or more objects (e.g., a previous trajectory, a previous action, a previous position, a previous acceleration, or other state or behavior of the object.) or vehicle state data associated with an autonomous vehicle.

In some examples, the vehicle computing device may provide data associated with training the machine learned model to a remote computing device (i.e., computing device separate from vehicle computing device) for data analysis. In such examples, the remote computing device may analyze the data to determine one or more labels for images, an actual location, yaw, speed, acceleration, direction of travel, or the like of the object at the end of the set of estimated states. In some such examples, ground truth data associated with one or more of: positions, trajectories, accelerations, directions, and so may be determined (either hand labelled or determined by another machine learned model) and such ground truth data may be used to determine a trajectory of another object such as a vehicle. In some examples, corresponding data may be input into the model to determine an output (e.g., a bounding box, object state data, and so on) and a difference between the determined output, and the actual action by the object may be used to train the model.

Typically, a variable autoencoder includes training a decoder to output data having a similar number of channels, data size, data format, etc. as an output by the encoder. Using the diffusion model to condition a decoder as described herein enables the decoder to output data different from the output by the encoder (e.g., object representations can be determined from map data and latent variable data). In some examples, the decoder can output data having a different number of channels than a number of channels associated with the input data. For instance, the training component 602 can determine a reconstruction loss to train the decoder to account for the greater number of channels output by the decoder.

Figure 7:
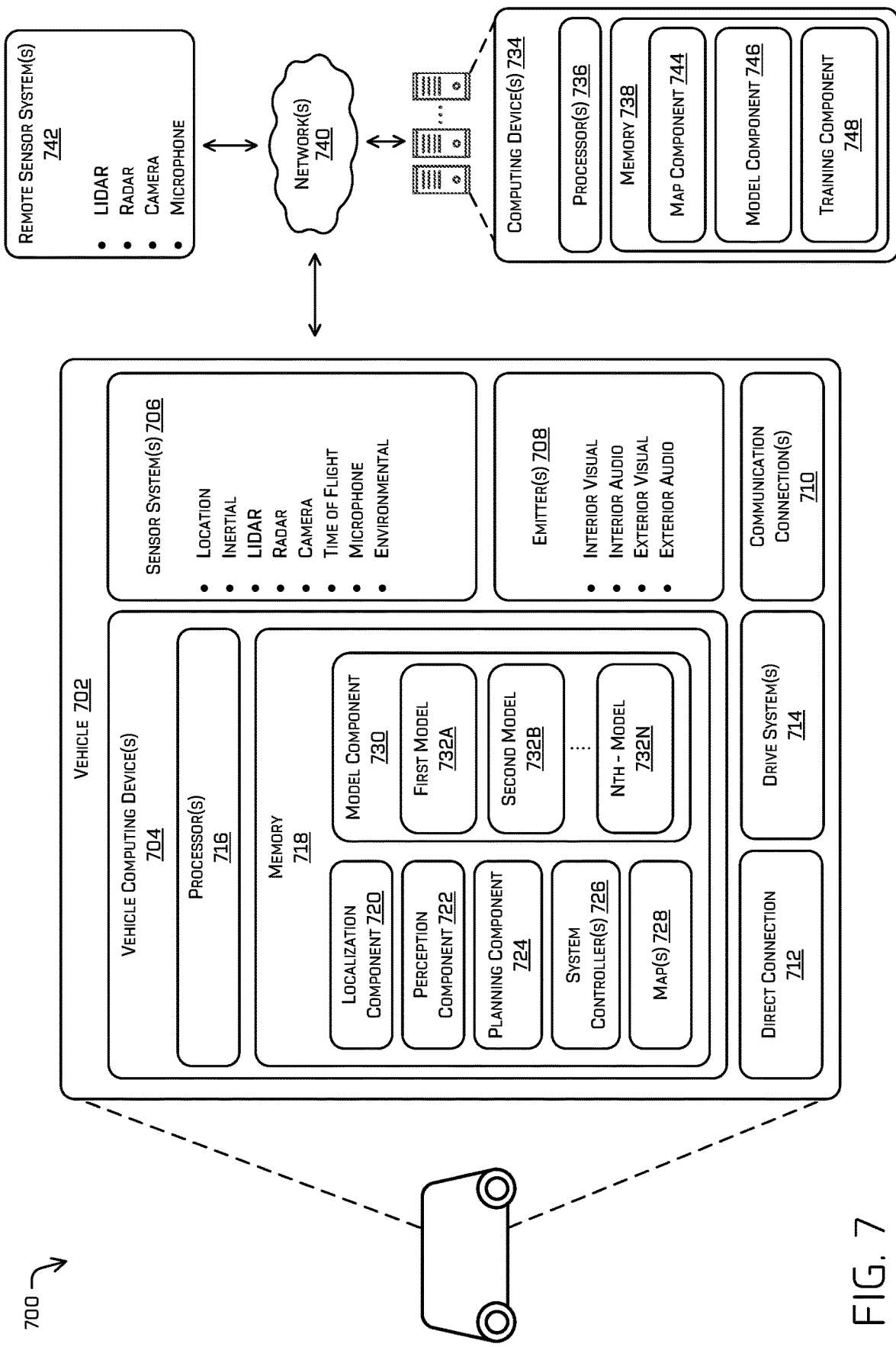
FIG. 7 is a block diagram of an example system for implementing the techniques described herein.

FIG. 7 is a block diagram of an example system 700 for implementing the techniques described herein. In at least one example, the system 700 may include a vehicle, such as vehicle 702.

The vehicle 702 may include a vehicle computing device(s) 704, one or more sensor systems 706, one or more emitters 708, one or more communication connections 710, at least one direct connection 712, and one or more drive system(s) 714.

The vehicle computing device(s) 704 may include one or more processors 716 and memory 718 communicatively coupled with the one or more processors 716. In the illustrated example, the vehicle 702 is an autonomous vehicle; however, the vehicle 702 could be any other type of vehicle, such as a semi-autonomous vehicle, or any other system having at least an image capture device (e.g., a camera enabled smartphone). In some instances, the autonomous vehicle 702 may be an autonomous vehicle configured to operate according to a Level 5 classification issued by the U.S. National Highway Traffic Safety Administration, which describes a vehicle capable of performing all safety-critical functions for the entire trip, with the driver (or occupant) not being expected to control the vehicle at any time. However, in other examples, the autonomous vehicle 702 may be a fully or partially autonomous vehicle having any other level or classification.

In various examples, the vehicle computing device(s) 704 may store sensor data associated with actual location of an object at the end of the set of estimated states (e.g., end of the period of time) and may use this data as training data to train one or more models. In some examples, the vehicle computing device(s) 704 may provide the data to a remote computing device (i.e., computing device separate from vehicle computing device such as the computing device(s) 734) for data analysis. In such examples, the remote computing device(s) may analyze the sensor data to determine an actual location, velocity, direction of travel, or the like of the object at the end of the set of estimated states. Additional details of training a machine learned model based on stored sensor data by minimizing differences between actual and predicted positions and/or predicted trajectories is described in U.S. patent application Ser. No. 16/282,201, filed on Mar. 12, 2019, entitled "Motion Prediction Based on Appearance," which is incorporated herein by reference in its entirety and for all purposes.

In the illustrated example, the memory 718 of the vehicle computing device(s) 704 stores a localization component 720, a perception component 722, a planning component 724, one or more system controllers 726, one or more maps 728, and a model component 730 including one or more model(s), such as a first model 732A, a second model 732B, up to an Nth model 732N (collectively "models 732"), where N is an integer. Though depicted in FIG. 7 as residing in the memory 718 for illustrative purposes, it is contemplated that the localization component 720, a perception component 722, a planning component 724, one or more system controllers 726, one or more maps 728, and/or the model component 730 including the model(s) 732 may additionally, or alternatively, be accessible to the vehicle 702 (e.g., stored on, or otherwise accessible by, memory remote from the vehicle 702, such as, for example, on memory 738 of a remote computing device 734). In some examples, the model(s) 732 can provide functionality associated with the prediction component 104. In some examples, the model(s) 732 can include one or more of: an encoder, a quantizer, a codebook, a decoder, a transformer model, a machine learned model, and so on.

In at least one example, the localization component 720 may include functionality to receive data from the sensor system(s) 706 to determine a position and/or orientation of the vehicle 702 (e.g., one or more of an x-, y-, z-position, roll, pitch, or yaw). For example, the localization component 720 may include and/or request/receive a map of an environment, such as from map(s) 728 and/or map component 744, and may continuously determine a location and/or orientation of the autonomous vehicle within the map. In some instances, the localization component 720 may utilize SLAM (simultaneous localization and mapping), CLAMS (calibration, localization and mapping, simultaneously), relative SLAM, bundle adjustment, non-linear least squares optimization, or the like to receive image data, lidar data, radar data, IMU data, GPS data, wheel encoder data, and the like to accurately determine a location of the autonomous vehicle. In some instances, the localization component 720 may provide data to various components of the vehicle 702 to determine an initial position of an autonomous vehicle for determining the relevance of an object to the vehicle 702, as discussed herein.

In some instances, the perception component 722 may include functionality to perform object detection, segmentation, and/or classification. In some examples, the perception component 722 may provide processed sensor data that indicates a presence of an object (e.g., entity) that is proximate to the vehicle 702 and/or a classification of the object as an object type (e.g., car, pedestrian, cyclist, animal, building, tree, road surface, curb, sidewalk, unknown, etc.). In some examples, the perception component 722 may provide processed sensor data that indicates a presence of a stationary entity that is proximate to the vehicle 702 and/or a classification of the stationary entity as a type (e.g., building, tree, road surface, curb, sidewalk, unknown, etc.). In additional or alternative examples, the perception component 722 may provide processed sensor data that indicates one or more features associated with a detected object (e.g., a tracked object) and/or the environment in which the object is positioned. In some examples, features associated with an object may include, but are not limited to, an x-position (global and/or local position), a y-position (global and/or local position), a z-position (global and/or local position), an orientation (e.g., a roll, pitch, yaw), an object type (e.g., a classification), a velocity of the object, an acceleration of the object, an extent of the object (size), etc. Features associated with the environment may include, but are not limited to, a presence of another object in the environment, a state of another object in the environment, a time of day, a day of a week, a season, a weather condition, an indication of darkness/light, etc.

In general, the planning component 724 may determine a path for the vehicle 702 to follow to traverse through an environment. For example, the planning component 724 may determine various routes and trajectories and various levels of detail. For example, the planning component 724 may determine a route to travel from a first location (e.g., a current location) to a second location (e.g., a target location). For the purpose of this discussion, a route may include a sequence of waypoints for travelling between two locations. As non-limiting examples, waypoints include streets, intersections, global positioning system (GPS) coordinates, etc. Further, the planning component 724 may generate an instruction for guiding the autonomous vehicle along at least a portion of the route from the first location to the second location. In at least one example, the planning component 724 may determine how to guide the autonomous vehicle from a first waypoint in the sequence of waypoints to a second waypoint in the sequence of waypoints. In some examples, the instruction may be a trajectory, or a portion of a trajectory. In some examples, multiple trajectories may be substantially simultaneously generated (e.g., within technical tolerances) in accordance with a receding horizon technique, wherein one of the multiple trajectories is selected for the vehicle 702 to navigate.

In some examples, the planning component 724 may include a prediction component to generate predicted trajectories of objects (e.g., objects) in an environment and/or to generate predicted candidate trajectories for the vehicle 702. For example, a prediction component may generate one or more predicted trajectories for objects within a threshold distance from the vehicle 702. In some examples, a prediction component may measure a trace of an object and generate a trajectory for the object based on observed and predicted behavior.

In at least one example, the vehicle computing device(s) 704 may include one or more system controllers 726, which may be configured to control steering, propulsion, braking, safety, emitters, communication, and other systems of the vehicle 702. The system controller(s) 726 may communicate with and/or control corresponding systems of the drive system(s) 714 and/or other components of the vehicle 702.

The memory 718 may further include one or more maps 728 that may be used by the vehicle 702 to navigate within the environment. For the purpose of this discussion, a map may be any number of data structures modeled in two dimensions, three dimensions, or N-dimensions that are capable of providing information about an environment, such as, but not limited to, topologies (such as intersections), streets, mountain ranges, roads, terrain, and the environment in general. In some instances, a map may include, but is not limited to: texture information (e.g., color information (e.g., RGB color information, Lab color information, HSV/HSL color information), and the like), intensity information (e.g., lidar information, radar information, and the like); spatial information (e.g., image data projected onto a mesh, individual "surfels" (e.g., polygons associated with individual color and/or intensity)), reflectivity information (e.g., specularity information, retroreflectivity information, BRDF information, BSSRDF information, and the like). In one example, a map may include a three-dimensional mesh of the environment. In some examples, the vehicle 702 may be controlled based at least in part on the map(s) 728. That is, the map(s) 728 may be used in connection with the localization component 720, the perception component 722, and/or the planning component 724 to determine a location of the vehicle 702, detect objects in an environment, generate routes, determine actions and/or trajectories to navigate within an environment.

In some examples, the one or more maps 728 may be stored on a remote computing device(s) (such as the computing device(s) 734) accessible via network(s) 740. In some examples, multiple maps 728 may be stored based on, for example, a characteristic (e.g., type of entity, time of day, day of week, season of the year, etc.). Storing multiple maps 728 may have similar memory requirements, but increase the speed at which data in a map may be accessed.

As illustrated in FIG. 7, the vehicle computing device(s) 704 may include a model component 730. The model component 730 may be configured to perform the functionality of the prediction component 104, including predicting object trajectories, scene data, and/or heat maps based at least in part on tokens associated with a codebook. In various examples, the model component 730 may receive one or more features associated with the detected object(s) from the perception component 722 and/or from the sensor system(s) 706. In some examples, the model component 730 may receive environment characteristics (e.g., environmental factors, etc.) and/or weather characteristics (e.g., weather factors such as snow; rain, ice, etc.) from the perception component 722 and/or the sensor system(s) 706. While shown separately in FIG. 7, the model component 730 could be part of the planning component 724 or other component(s) of the vehicle 702.

In various examples, the model component 730 may send predictions from the one or more models 732 that may be used by the planning component 724 to generate one or more predicted trajectories of the object (e.g., direction of travel, speed, etc.) and/or one or more predicted trajectories of the object (e.g., direction of travel, speed, etc.), such as from the prediction component thereof. In some examples, the planning component 724 may determine one or more actions (e.g., reference actions and/or sub-actions) for the vehicle 702, such as vehicle candidate trajectories. In some examples, the model component 730 may be configured to determine whether an object occupies a future position based at least in part on the one or more actions for the vehicle 702. In some examples, the model component 730 may be configured to determine the actions that are applicable to the environment, such as based on environment characteristics, weather characteristics, another object, or the like.

The model component 730 may generate sets of estimated states of the vehicle and one or more detected objects forward in the environment over a time period. The model component 730 may generate a set of estimated states for each action (e.g., reference action and/or sub-action) determined to be applicable to the environment. The sets of estimated states may include one or more estimated states, each estimated state including an estimated position of the vehicle and an estimated position of a detected object(s). In some examples, the estimated states may include estimated positions of the detected objects at an initial time (T=0) (e.g., current time).

The estimated positions may be determined based on a detected trajectory and/or predicted trajectories associated with the object. In some examples, the estimated positions may be determined based on an assumption of substantially constant velocity and/or substantially constant trajectory (e.g., little to no lateral movement of the object). In some examples, the estimated positions (and/or potential trajectories) may be based on passive and/or active prediction. In some examples, the model component 730 may utilize physics and/or geometry based techniques, machine learning, linear temporal logic, tree search methods, heat maps, and/or other techniques for determining predicted trajectories and/or estimated positions of objects.

In various examples, the estimated states may be generated periodically throughout the time period. For example, the model component 730 may generate estimated states at 0.1 second intervals throughout the time period. For another example, the model component 730 may generate estimated states at 0.05 second intervals. The estimated states may be used by the planning component 724 in determining an action for the vehicle 702 to take in an environment.

In various examples, the model component 730 may utilize machine learned techniques to predict object trajectories and scene data. In such examples, the machine learned algorithms may be trained to determine, based on sensor data and/or previous predictions by the model, that an object is likely to behave in a particular way relative to the vehicle 702 at a particular time during a set of estimated states (e.g., time period). In such examples, one or more of the vehicle 702 state (position, velocity, acceleration, trajectory, etc.) and/or the object state, classification, etc. may be input into such a machine learned model and, in turn, a trajectory prediction may be output by the model.

In various examples, characteristics associated with each object type may be used by the model component 730 to determine a trajectory, a velocity, or an acceleration associated with the object. Examples of characteristics of an object type may include, but not be limited to: a maximum longitudinal acceleration, a maximum lateral acceleration, a maximum vertical acceleration, a maximum speed, maximum change in direction for a given speed, and the like.

As can be understood, the components discussed herein (e.g., the localization component 720, the perception component 722, the planning component 724, the one or more system controllers 726, the one or more maps 728, the model component 730 including the model(s) 732 are described as divided for illustrative purposes. However, the operations performed by the various components may be combined or performed in any other component.

While examples are given in which the techniques described herein are implemented by a planning component and/or a model component of the vehicle, in some examples, some or all of the techniques described herein could be implemented by another system of the vehicle, such as a secondary safety system. Generally, such an architecture can include a first computing device to control the vehicle 702 and a secondary safety system that operates on the vehicle 702 to validate operation of the primary system and to control the vehicle 702 to avoid collisions.

In some instances, aspects of some or all of the components discussed herein may include any models, techniques, and/or machine learned techniques. For example, in some instances, the components in the memory 718 (and the memory 738, discussed below) may be implemented as a neural network.

As described herein, an exemplary neural network is a technique which passes input data through a series of connected layers to produce an output. Each layer in a neural network may also comprise another neural network, or may comprise any number of layers (whether convolutional or not). As can be understood in the context of this disclosure, a neural network may utilize machine learning, which may refer to a broad class of such techniques in which an output is generated based on learned parameters.

Although discussed in the context of neural networks, any type of machine learning may be used consistent with this disclosure. For example, machine learning techniques may include, but are not limited to, regression techniques (e.g., ordinary least squares regression (OLSR), linear regression, logistic regression, stepwise regression, multivariate adaptive regression splines (MARS), locally estimated scatterplot smoothing (LOESS)), instance-based techniques (e.g., ridge regression, least absolute shrinkage and selection operator (LASSO), elastic net, least-angle regression (LARS)), decisions tree techniques (e.g., classification and regression tree (CART), iterative dichotomiser 3 (ID3), Chi-squared automatic interaction detection (CHAID), decision stump, conditional decision trees), Bayesian techniques (e.g., naïve Bayes, Gaussian naïve Bayes, multinomial naïve Bayes, average one-dependence estimators (AODE), Bayesian belief network (BNN), Bayesian networks), clustering techniques (e.g., k-means, k-medians, expectation maximization (EM), hierarchical clustering), association rule learning techniques (e.g., perceptron, back-propagation, hopfield network, Radial Basis Function Network (RBFN)), deep learning techniques (e.g., Deep Boltzmann Machine (DBM), Deep Belief Networks (DBN), Convolutional Neural Network (CNN), Stacked Auto-Encoders), Dimensionality Reduction Techniques (e.g., Principal Component Analysis (PCA), Principal Component Regression (PCR), Partial Least Squares Regression (PLSR), Sammon Mapping, Multidimensional Scaling (MDS), Projection Pursuit, Linear Discriminant Analysis (LDA), Mixture Discriminant Analysis (MDA), Quadratic Discriminant Analysis (QDA), Flexible Discriminant Analysis (FDA)), Ensemble Techniques (e.g., Boosting, Bootstrapped Aggregation (Bagging), AdaBoost, Stacked Generalization (blending), Gradient Boosting Machines (GBM), Gradient Boosted Regression Trees (GBRT), Random Forest), SVM (support vector machine), supervised learning, unsupervised learning, semi-supervised learning, etc. Additional examples of architectures include neural networks such as ResNet50, ResNet101, VGG, DenseNet, PointNet, and the like.

In at least one example, the sensor system(s) 706 may include lidar sensors, radar sensors, ultrasonic transducers, sonar sensors, location sensors (e.g., GPS, compass, etc.), inertial sensors (e.g., inertial measurement units (IMUs), accelerometers, magnetometers, gyroscopes, etc.), cameras (e.g., RGB, IR, intensity, depth, time of flight, etc.), microphones, wheel encoders, environment sensors (e.g., temperature sensors, humidity sensors, light sensors, pressure sensors, etc.), etc. The sensor system(s) 706 may include multiple instances of each of these or other types of sensors. For instance, the lidar sensors may include individual lidar sensors located at the corners, front, back, sides, and/or top of the vehicle 702. As another example, the camera sensors may include multiple cameras disposed at various locations about the exterior and/or interior of the vehicle 702. The sensor system(s) 706 may provide input to the vehicle computing device(s) 704. Additionally, or in the alternative, the sensor system(s) 706 may send sensor data, via the one or more networks 740, to the one or more computing device(s) 734 at a particular frequency, after a lapse of a predetermined period of time, in near real-time, etc.

The vehicle 702 may also include one or more emitters 708 for emitting light and/or sound. The emitters 708 may include interior audio and visual emitters to communicate with passengers of the vehicle 702. By way of example and not limitation, interior emitters may include speakers, lights, signs, display screens, touch screens, haptic emitters (e.g., vibration and/or force feedback), mechanical actuators (e.g., seatbelt tensioners, seat positioners, headrest positioners, etc.), and the like. The emitter(s) 708 may also include exterior emitters. By way of example and not limitation, the exterior emitters may include lights to signal a direction of travel or other indicator of vehicle action (e.g., indicator lights, signs, light arrays, etc.), and one or more audio emitters (e.g., speakers, speaker arrays, horns, etc.) to audibly communicate with pedestrians or other nearby vehicles, one or more of which comprising acoustic beam steering technology.

The vehicle 702 may also include one or more communication connections 710 that enable communication between the vehicle 702 and one or more other local or remote computing device(s). For instance, the communication connection(s) 710 may facilitate communication with other local computing device(s) on the vehicle 702 and/or the drive system(s) 714. Also, the communication connection(s) 710 may allow the vehicle to communicate with other nearby computing device(s) (e.g., remote computing device 734, other nearby vehicles, etc.) and/or one or more remote sensor system(s) 742 for receiving sensor data. The communications connection(s) 710 also enable the vehicle 702 to communicate with a remote teleoperations computing device or other remote services.

The communications connection(s) 710 may include physical and/or logical interfaces for connecting the vehicle computing device(s) 704 to another computing device or a network, such as network(s) 740. For example, the communications connection(s) 710 can enable Wi-Fi-based communication such as via frequencies defined by the IEEE 802.11 standards, short range wireless frequencies such as Bluetooth, cellular communication (e.g., 2G, 3G, 4G, 4G LTE, 5G, etc.) or any suitable wired or wireless communications protocol that enables the respective computing device to interface with the other computing device(s).

In at least one example, the vehicle 702 may include one or more drive systems 714. In some examples, the vehicle 702 may have a single drive system 714. In at least one example, if the vehicle 702 has multiple drive systems 714, individual drive systems 714 may be positioned on opposite ends of the vehicle 702 (e.g., the front and the rear, etc.). In at least one example, the drive system(s) 714 may include one or more sensor systems to detect conditions of the drive system(s) 714 and/or the surroundings of the vehicle 702. By way of example and not limitation, the sensor system(s) may include one or more wheel encoders (e.g., rotary encoders) to sense rotation of the wheels of the drive modules, inertial sensors (e.g., inertial measurement units, accelerometers, gyroscopes, magnetometers, etc.) to measure orientation and acceleration of the drive module, cameras or other image sensors, ultrasonic sensors to acoustically detect objects in the surroundings of the drive module, lidar sensors, radar sensors, etc. Some sensors, such as the wheel encoders may be unique to the drive system(s) 714. In some cases, the sensor system(s) on the drive system(s) 714 may overlap or supplement corresponding systems of the vehicle 702 (e.g., sensor system(s) 706).

The drive system(s) 714 may include many of the vehicle systems, including a high voltage battery, a motor to propel the vehicle, an inverter to convert direct current from the battery into alternating current for use by other vehicle systems, a steering system including a steering motor and steering rack (which can be electric), a braking system including hydraulic or electric actuators, a suspension system including hydraulic and/or pneumatic components, a stability control system for distributing brake forces to mitigate loss of traction and maintain control, an HVAC system, lighting (e.g., lighting such as head/tail lights to illuminate an exterior surrounding of the vehicle), and one or more other systems (e.g., cooling system, safety systems, onboard charging system, other electrical components such as a DC/DC converter, a high voltage junction, a high voltage cable, charging system, charge port, etc.). Additionally, the drive system(s) 714 may include a drive module controller which may receive and preprocess data from the sensor system(s) and to control operation of the various vehicle systems. In some examples, the drive module controller may include one or more processors and memory communicatively coupled with the one or more processors. The memory may store one or more modules to perform various functionalities of the drive system(s) 714. Furthermore, the drive system(s) 714 may also include one or more communication connection(s) that enable communication by the respective drive module with one or more other local or remote computing device(s).

In at least one example, the direct connection 712 may provide a physical interface to couple the one or more drive system(s) 714 with the body of the vehicle 702. For example, the direct connection 712 may allow the transfer of energy, fluids, air, data, etc. between the drive system(s) 714 and the vehicle. In some instances, the direct connection 712 may further releasably secure the drive system(s) 714 to the body of the vehicle 702.

In at least one example, the localization component 720, the perception component 722, the planning component 724, the one or more system controllers 726, the one or more maps 728, and the model component 730, may process sensor data, as described above, and may send their respective outputs, over the one or more network(s) 740, to the computing device(s) 734. In at least one example, the localization component 720, the perception component 722, the planning component 724, the one or more system controllers 726, the one or more maps 728, and the model component 730 may send their respective outputs to the remote computing device(s) 734 at a particular frequency, after a lapse of a predetermined period of time, in near real-time, etc.

In some examples, the vehicle 702 may send sensor data to the computing device(s) 734 via the network(s) 740. In some examples, the vehicle 702 may receive sensor data from the computing device(s) 734 and/or remote sensor system(s) 742 via the network(s) 740. The sensor data may include raw sensor data and/or processed sensor data and/or representations of sensor data. In some examples, the sensor data (raw or processed) may be sent and/or received as one or more log files.

The computing device(s) 734 may include processor(s) 736 and a memory 738 storing the map component 744, a sensor data processing component 746, and a training component 748. In some examples, the map component 744 may include functionality to generate maps of various resolutions. In such examples, the map component 744 may send one or more maps to the vehicle computing device(s) 704 for navigational purposes. In various examples, the sensor data processing component 746 may be configured to receive data from one or more remote sensors, such as sensor system(s) 706 and/or remote sensor system(s) 742. In some examples, the sensor data processing component 746 may be configured to process the data and send processed sensor data to the vehicle computing device(s) 704, such as for use by the model component 730 (e.g., the model(s) 732). In some examples, the sensor data processing component 746 may be configured to send raw sensor data to the vehicle computing device(s) 704.

In some instances, the training component 748 (e.g., trained in accordance with the techniques discussed in FIG. 4) can include functionality to train a machine learning model to output probabilities for whether an occluded region is free of any objects or whether the occluded region is occupied by a static obstacle or a dynamic object. For example, the training component 748 can receive sensor data that represents an object traversing through an environment for a period of time, such as 0.1 milliseconds, 1 second, 3, seconds, 5 seconds, 7 seconds, and the like. At least a portion of the sensor data can be used as an input to train the machine learning model.

In some instances, the training component 748 may be executed by the processor(s) 736 to train a machine learning model based on training data. The training data may include a wide variety of data, such as sensor data, audio data, image data, map data, inertia data, vehicle state data, historical data (log data), or a combination thereof, that is associated with a value (e.g., a desired classification, inference, prediction, etc.). Such values may generally be referred to as a "ground truth." To illustrate, the training data may be used for determining risk associated with occluded regions and, as such, may include data representing an environment that is captured by an autonomous vehicle and that is associated with one or more classifications or determinations. In some examples, such a classification may be based on user input (e.g., user input indicating that the data depicts a specific risk) or may be based on the output of another machine learned model. In some examples, such labeled classifications (or more generally, the labeled output associated with training data) may be referred to as ground truth.

In some instances, the training component 748 can include functionality to train a machine learning model to output classification values. For example, the training component 748 can receive data that represents labelled collision data (e.g. publicly available data, sensor data, and/or a combination thereof). At least a portion of the data can be used as an input to train the machine learning model. Thus, by providing data where the vehicle traverses an environment, the training component 748 can be trained to output occluded value(s) associated with objects and/or occluded region(s), as discussed herein.

In some examples, the training component 748 can include training data that has been generated by a simulator. For example, simulated training data can represent examples where a vehicle collides with an object in an environment or nearly collides with an object in an environment, to provide additional training examples.

The processor(s) 716 of the vehicle 702 and the processor(s) 736 of the computing device(s) 734 may be any suitable processor capable of executing instructions to process data and perform operations as described herein. By way of example and not limitation, the processor(s) 716 and 736 may comprise one or more Central Processing Units (CPUs), Graphics Processing Units (GPUs), or any other device or portion of a device that processes electronic data to transform that electronic data into other electronic data that may be stored in registers and/or memory. In some examples, integrated circuits (e.g., ASICs, etc.), gate arrays (e.g., FPGAs, etc.), and other hardware devices may also be considered processors in so far as they are configured to implement encoded instructions.

Memory 718 and memory 738 are examples of non-transitory computer-readable media. The memory 718 and memory 738 may store an operating system and one or more software applications, instructions, programs, and/or data to implement the methods described herein and the functions attributed to the various systems. In various implementations, the memory may be implemented using any suitable memory technology, such as static random access memory (SRAM), synchronous dynamic RAM (SDRAM), nonvolatile/Flash-type memory, or any other type of memory capable of storing information. The architectures, systems, and individual elements described herein may include many other logical, programmatic, and physical components, of which those shown in the accompanying figures are merely examples that are related to the discussion herein.

It should be noted that while FIG. 7 is illustrated as a distributed system, in alternative examples, components of the vehicle 702 may be associated with the computing device(s) 734 and/or components of the computing device(s) 734 may be associated with the vehicle 702. That is, the vehicle 702 may perform one or more of the functions associated with the computing device(s) 734, and vice versa.

Figure 8:
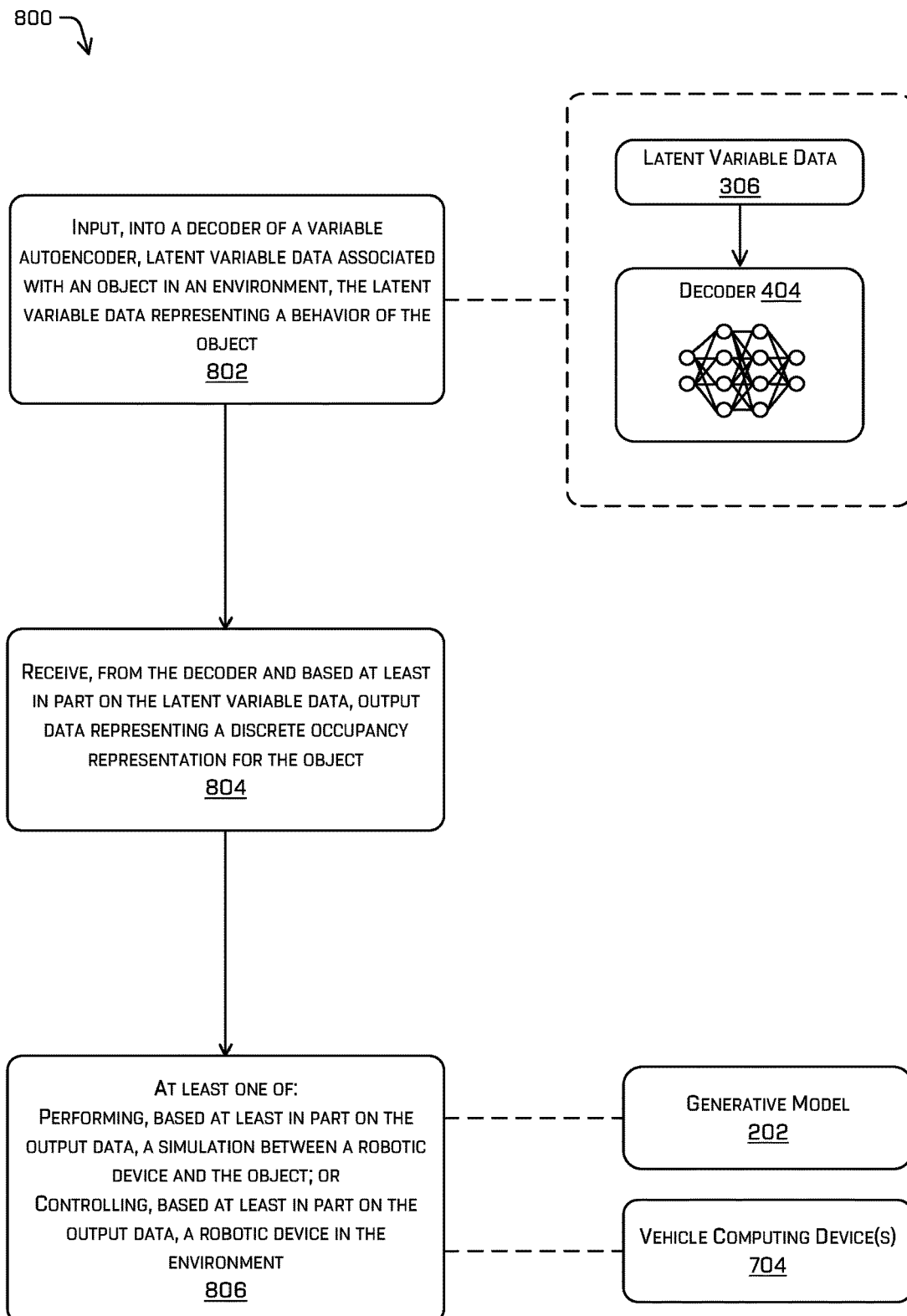
FIG. 8 is a flowchart depicting an example process for determining an object representation using one or more example models.

FIG. 8 is a flowchart depicting an example process 800 for determining an object representation using one or more example models. Some or all of the process 800 may be performed by one or more components in FIG. 7, as described herein. For example, some or all of process 800 may be performed by the vehicle computing device(s) 704.

At operation 802, the process may include inputting, as a first input into a decoder of a variable autoencoder, map data representing an environment. For example, the decoder 404 can receive the map data 204. In some examples, the map data 204 may represent fixed features of an environment including but not limited to crosswalks, traffic signals, school zones, and the like.

At operation 804, the process may include inputting, as a second input into the decoder, latent variable data associated with an object in the environment, the latent variable data representing a behavior of the object. For example, the operation 804 can include the decoder 404 receiving the latent variable data 306 from the diffusion model 304. In some examples, the latent variable data 306 may represent a behavior (e.g., a state or intent) of one or more objects such as a position, a trajectory, an orientation, etc. associated with a previous time. In some examples, the latent variable data 306 can include scene attributes and/or control policy information to include in a simulation. In various examples, the latent variable data 306 may represent discrete features of different objects proximate an autonomous vehicle (e.g., discrete latent variable data representing a first action of the first object and a second action of the second object).

At operation 806, the process may include receiving, from the decoder and based at least in part on the first input and the second input, output data representing an occupancy representation for the object and an orientation of the object. For instance, the decoder 404 can output the bounding box data 206, a heatmap, or other representation of an object that indicates an orientation of the object (or associated with bounding box) in the environment. The bounding box data 206 can include a first bounding box having a first orientation for the first object and a second bounding box having a second orientation for the second object. In some examples, the output data is based at least in part on determining an object type for an object to "add" to the map data. In some examples, the decoder can represent the generative model 202 of FIG. 2.

At operation 808, the process may include at least one of: performing, based at least in part on the output data, a simulation between a vehicle, the first object, and the second object; or transmitting the output data to a component of a vehicle computing device that is configured to control the vehicle in the environment relative to the first object and the second object. For example, the generative model 202 can send the bounding box data 206 to the machine learned model 214 for performing a simulation and/or for controlling the robotic device (e.g., the autonomous vehicle). In such examples, the machine learned model 214 can be associated with a computing device coupled to a vehicle (e.g., the vehicle computing device(s) 704) or a computing device remote from the vehicle (e.g., the computing device(s) 734). In examples when the output data is transmitted to a vehicle (e.g., the vehicle 102, the vehicle 702), the vehicle computing device can determine a trajectory for the vehicle (e.g., vehicle trajectory 118 based at least in part on the output data from the decoder. Additional details of performing a simulation or controlling a vehicle using one or more outputs from one or more models are discussed throughout the disclosure.

Figure 9:
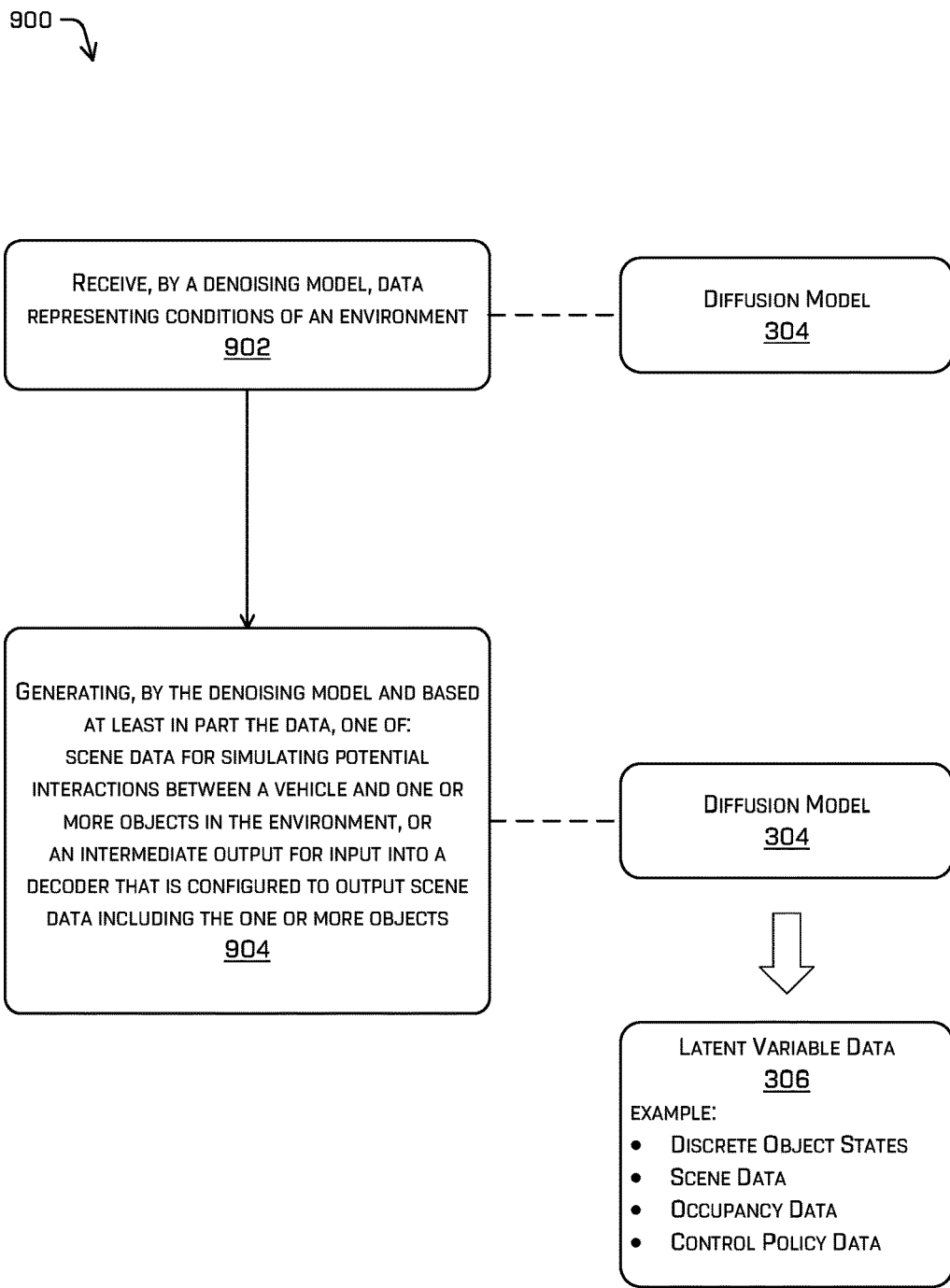
FIG. 9 is a flowchart depicting an example process for determining scene data using one or more example models.

FIG. 9 is a flowchart depicting an example process 900 for determining scene data using one or more example models. Some or all of the process 900 may be performed by one or more components in FIG. 7, as described herein. For example, some or all of process 900 may be performed by the vehicle computing device(s) 704.

At operation 902, the process may include receiving, by a generative model and from a decoder, occupancy data associated with one or more objects in an environment. For example, the machine learned model 214 can receive the bounding box data 206 representing occupancy for one or more objects in the environment. In some examples, the machine learned model 214 represents a transformer model and the condition data comprises one or more tokens to represent a potential action of different objects. In some examples, the machine learned model 214 represents a Graph Neural Network and the condition data comprises a node to represent a potential action of an object. Additional or alternatively, the occupancy data can comprise heatmap data indicating a probability of an object of the one or more objects occupying an area in the environment.

At operation 904, the process may include receiving, by the generative model and from a diffusion model, condition data representing image data or text data associated with the object or the environment. For example, the machine learned model 214 can receive the condition data 308 comprising text data describing an intersection type, a number of objects in the environment, or a scene characteristic to include in a scene or simulation. The condition data 308 can include one or more of: a scalar value representing the scene characteristic (e.g., scene density), token information, node information, etc.

Figure 10:
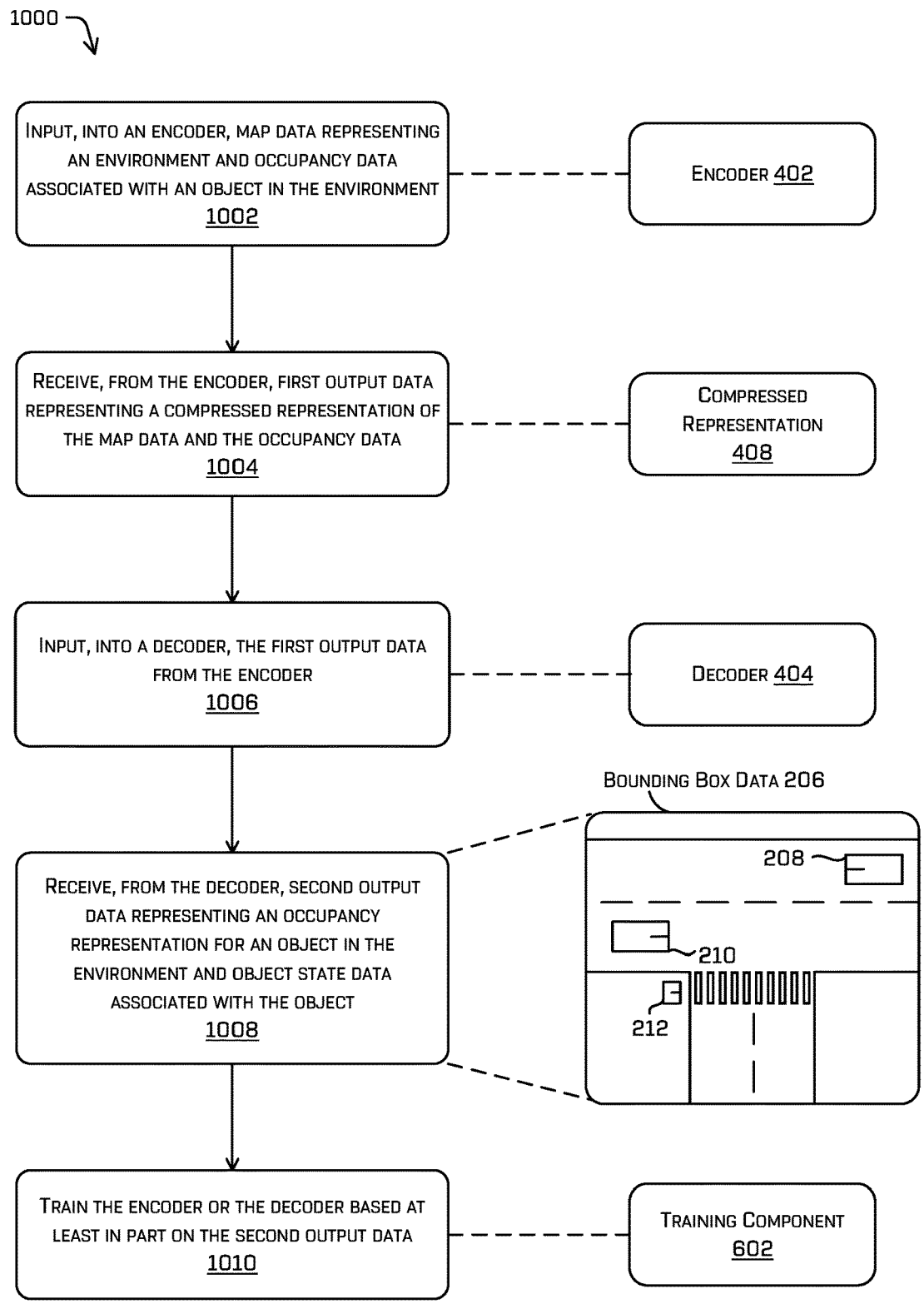
FIG. 10 is flowchart depicting an example process for training a variable autoencoder using an example training component.

At operation 906, the process may include determining, by the generative model and based at least in part on the occupancy data and the condition data, scene data for simulating potential interactions between a vehicle and the one or more objects. For instance, the machine learned model 214 can determine the output data 216 representing scene data for use in a simulation. In some examples, the machine learned model 214 can determine the scene data based at least in part on a planner cost associated with a planning component of a vehicle computing device that indicates an impact on available computational resources for the planning component to determine output data. For example, the planning component can provide output data that controls the vehicle in an environment, and a cost can be determined that measures performance by the planning component relative to available processor and/or memory resources. In some examples, the model can compare comparing the planner cost to a cost threshold and determine the scene data based at least in part on the planner cost meeting or exceeding the cost threshold. In this way, scene data that represents different levels of difficulty for determining an out by the planning component, FIG. 10 is flowchart depicting an example process 1000 for training a variable autoencoder using an example training component. Some or all of the process 1000 may be performed by one or more components in FIG. 7, as described herein. For example, some or all of process 1000 may be performed by the training component 602 and/or the training component 748.

At operation 1002, the process may include inputting, as first input data into an encoder of a variable autoencoder, map data representing an environment and occupancy data associated with an object in the environment. For example, the encoder 402 of the variable autoencoder 302 can receive the map data 204 and the occupancy data 406 as input. In some examples, map data can be received that represents fixed features of the environment including but not limited to crosswalks, traffic signals, school zones, and the like. The occupancy data 406 can represent occupancy information associated with an object.

At operation 1004, the process may include receiving, from the encoder, first output data representing a compressed representation of the first input data. For example, the encoder 402 can output the compressed representation 408 of the map data 204 and the occupancy data 406. The compressed representation of the first input data can represent a latent embedding of the first input data.

At operation 1006, the process may include receiving, from a diffusion model, discrete latent variable data associated with the object. For example, the diffusion model 304 can provide the latent variable data 306 to the decoder 404 as part of input data for processing by the decoder 404. The latent variable data 306 can describe a discrete state or feature of the object and/or the environment. In some examples, the latent variable data 306 can be used to determine how and where to include an object(s) in the environment associated with the map data 204. By way of example and not limitation, the latent variable data associated with the object can indicate an acceleration action, a braking action, or a steering action of the object, to name a few.

At operation 1008, the process may include inputting, as second input data into a decoder of the variable autoencoder, the first output data from the encoder and the discrete latent variable data from the diffusion model. For example, data associated with an output by the encoder 402 can be input into the decoder 404 along with the latent variable data 306 (e.g., as a concatenated input).

At operation 1010, the process may include receiving, from the decoder, second output data representing an occupancy representation for an object in the environment and object state data associated with the object. For example, the decoder 404 can output the bounding box data 206 and/or heatmap data associated with one or more objects in the environment. In various examples, the object state data indicates an acceleration, a velocity, an orientation, a position, or other state of the object associated with a previous, current, or future time.

At operation 1012, the process may include training the encoder or the decoder based at least in part on the second output data. For example, the training component 602 can compare the first output data or the second output data to ground truth and train the encoder or the decoder based at least in part on the comparison. In various examples, data associated with a trained machine learned model can be transmitted to a vehicle computing device for use in controlling an autonomous vehicle in an environment.

Figure 11:
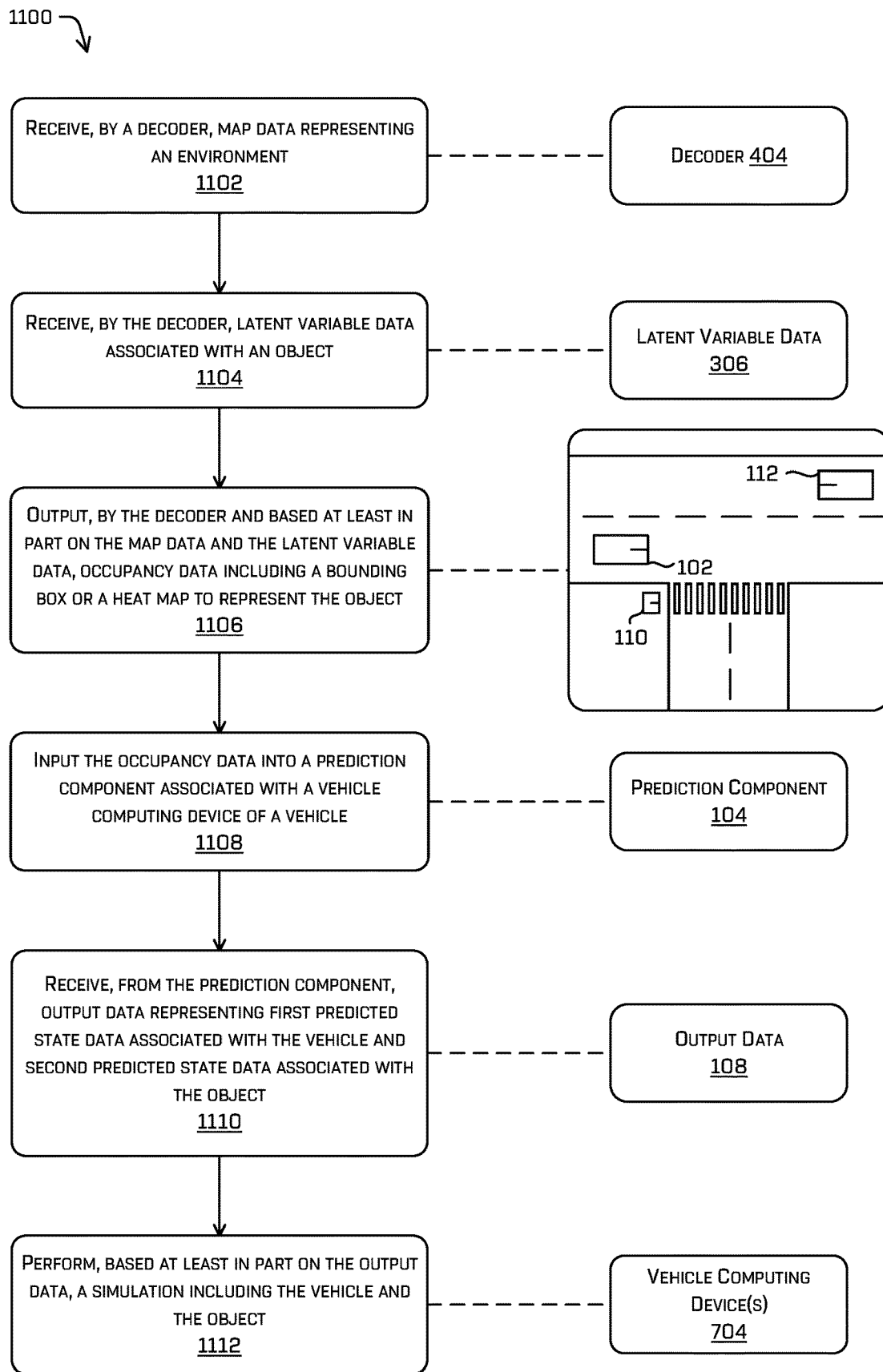
FIG. 11 is flowchart depicting an example process for performing a simulation using an example prediction component.

FIG. 11 is a flowchart depicting an example process 1100 for performing a simulation using an example prediction component. Some or all of the process 1100 may be performed by one or more components in FIG. 7, as described herein. For example, some or all of process 1100 may be performed by the vehicle computing device 704.

At operation 1102, the process may include receiving, by a decoder, map data representing an environment. For example, the decoder 404 can receive the map data 204. In some examples, the map data 204 may represent fixed features of an environment including but not limited to crosswalks, traffic signals, school zones, and the like.

At operation 1104, the process may include receiving, by the decoder, latent variable data associated with an object. For example, the diffusion model 304 can provide the latent variable data 306 to the decoder 404 as part of input data for processing by the decoder 404. The latent variable data 306 can describe a discrete state or feature of the object and/or the environment. In some examples, the latent variable data 306 can be used to determine how and where to include an object(s) in the environment associated with the map data 204.

At operation 1106, the process may include outputting, by the decoder and based at least in part on the map data and the latent variable data, occupancy data including a bounding box or a heat map to represent the object. For instance, the decoder 404 can output the bounding box data 206, a heatmap, or other representation of an object that indicates an orientation of the object (or associated with bounding box) in the environment. The bounding box data 206 can include a first bounding box having a first orientation for the first object and a second bounding box having a second orientation for the second object.

At operation 1108, the process may include inputting the occupancy data into a prediction component associated with a vehicle computing device of a vehicle. For example, the prediction component 104 can receive the map data 204 and the occupancy data 406 as input. In some examples, map data can be received that represents fixed features of the environment including but not limited to crosswalks, traffic signals, school zones, and the like. The occupancy data 406 can represent a bounding box or heatmap associated with an object such as the bounding box data 206.

At operation 1110, the process may include receiving, from the prediction component, output data representing first predicted state data associated with the vehicle and second predicted state data associated with the object. For instance, the operation 1110 can include the prediction component 104 outputting the output data 108 representing state data for the vehicle 102 and state data for one or more objects (e.g., the objects 110 and 112).

At operation 1112, the process may include performing, based at least in part on the output data, a simulation including the vehicle and the object. For example, the operation 1112 may include the output data 106 from the prediction component 104 being used by a machine learned model to perform a simulation between the vehicle and one or more objects associated with the predicted state data. In various examples, the vehicle computing device may control operation of the vehicle, such as the planning component 724 based at least in part on an output of the simulation. In some examples, the output(s) by the prediction component is usable for performing a simulation over time by the vehicle computing device. In some examples, output data associated with prediction component 104 is transmitted to a vehicle (e.g., the vehicle 102, the vehicle 702) and an associated vehicle computing device can determine a trajectory for the vehicle (e.g., vehicle trajectory 118).

FIGS. 8-11 illustrate example processes in accordance with examples of the disclosure. These processes are illustrated as logical flow graphs, each operation of which represents a sequence of operations that can be implemented in hardware, software, or a combination thereof. In the context of software, the operations represent computer-executable instructions stored on one or more computer-readable storage media that, when executed by one or more processors, perform the recited operations. Generally, computer-executable instructions include routines, programs, objects, components, data structures, and the like that perform particular functions or implement particular abstract data types. The order in which the operations are described is not intended to be construed as a limitation, and any number of the described operations can be omitted or combined in any order and/or in parallel to implement the processes. In some embodiments, one or more operations of the method may be omitted entirely. Moreover, the methods described herein can be combined in whole or in part with each other or with other methods.

The methods described herein represent sequences of operations that can be implemented in hardware, software, or a combination thereof. In the context of software, the blocks represent computer-executable instructions stored on one or more computer-readable storage media that, when executed by one or more processors, perform the recited operations. Generally, computer-executable instructions include routines, programs, objects, components, data structures, and the like that perform particular functions or implement particular abstract data types. The order in which the operations are described is not intended to be construed as a limitation, and any number of the described operations can be omitted or combined in any order and/or in parallel to implement the processes.

The various techniques described herein may be implemented in the context of computer-executable instructions or software, such as program modules, that are stored in computer-readable storage and executed by the processor(s) of one or more computing devices such as those illustrated in the figures. Generally, program modules include routines, programs, objects, components, data structures, etc., and define operating logic for performing particular tasks or implement particular abstract data types.

Other architectures may be used to implement the described functionality and are intended to be within the scope of this disclosure. Furthermore, although specific distributions of responsibilities are defined above for purposes of discussion, the various functions and responsibilities might be distributed and divided in different ways, depending on circumstances.

Similarly, software may be stored and distributed in various ways and using different means, and the particular software storage and execution configurations described above may be varied in many different ways. Thus, software implementing the techniques described above may be distributed on various types of computer-readable media, not limited to the forms of memory that are specifically described.

Example Clauses

Any of the example clauses in this section may be used with any other of the example clauses and/or any of the other examples or embodiments described herein.

A: A system comprising: one or more processors; and one or more non-transitory computer-readable media storing instructions executable by the one or more processors, wherein the instructions, when executed, cause the one or more processors to perform operations comprising: inputting, as a first input into a decoder of a variable autoencoder, map data representing an environment; inputting, as a second input into the decoder, discrete latent variable data associated with a first object and a second object in the environment, the discrete latent variable data representing a first action of the first object and a second action of the second object, the second action different than the first action; receiving, from the decoder and based at least in part on the first input and the second input, output data representing a first bounding box for the first object and a second bounding box for the second object, the first bounding box including a first orientation and the second bounding box including a second orientation; and at least one of: performing, based at least in part on the output data, a simulation between a vehicle, the first object, and the second object; or controlling, based at least in part on the output data, the vehicle in the environment relative to the first object and the second object.

B: The system of paragraph A, wherein a first number of channels associated with the output data from the decoder is greater than a second number of channels associated with the first input.

C: The system of paragraph A or B, the operations further comprising: determining an object type associated with the first object or the second object; and determining the output data based at least in part on the object type.

D: The system of any of paragraphs A-C, wherein the discrete latent variable data is received from a diffusion model configured to receive input data, determine cross attention data between the first object and the second object, and output the discrete latent variable data based at least in part on the cross attention data.

E: The system of paragraph D, wherein the diffusion model determines a number of objects to include in the environment based at least in part on condition data.

F: One or more non-transitory computer-readable media storing instructions that, when executed, cause one or more processors to perform operations comprising: inputting, into a decoder of a variable autoencoder, latent variable data associated with an object in an environment, the latent variable data representing a behavior of the object; receiving, from the decoder and based at least in part on the latent variable data, output data representing a discrete occupancy representation for the object; and at least one of: performing, based at least in part on the output data, a simulation between a robotic device and the object; or controlling, based at least in part on the output data, a robotic device in the environment.

G: The one or more non-transitory computer-readable media of paragraph F, wherein the latent variable data comprises discrete latent variable data representing at least one of an action, an intent, or an attribute of the object for use during the simulation, and the operations further comprising: inputting map data representing the environment into the decoder; and determining, by the decoder, the output data based at least in part on the map data.

H: The one or more non-transitory computer-readable media of paragraph F or G, wherein: the object is a first object, the behavior is a first behavior, the latent variable data further represents a second behavior of a second object, and the output data comprises a second occupancy representation.

I: The one or more non-transitory computer-readable media of any of paragraphs F-H, wherein a first number of channels associated with the output data from the decoder is greater than a second number of channels associated with an input to an encoder of the variable autoencoder.

J: The one or more non-transitory computer-readable media of any of paragraphs F-I, wherein the output data further represents an orientation of the object.

K: The one or more non-transitory computer-readable media of any of paragraphs F-J, wherein the latent variable data is received from a diffusion model configured to receive input data and apply an algorithm to denoise the input data.

L: The one or more non-transitory computer-readable media of paragraph K, wherein the diffusion model determines a number of objects to include in the environment.

M: The one or more non-transitory computer-readable media of any of paragraphs F-L, the operations further comprising: determining, based at least in part on the output data, one or more of: a position, a size, an acceleration, or a velocity of the object at a future time.

N: The one or more non-transitory computer-readable media of any of paragraphs F-M, wherein the occupancy representation for the object comprises a bounding box representing a two-dimensional shape or a three-dimensional shape of the object for a current time.

O: The one or more non-transitory computer-readable media of any of paragraphs F-N, wherein the output data comprises a vector representation of the object.

P: The one or more non-transitory computer-readable media of any of paragraphs F-O, wherein: the decoder is trained based at least in part on an output from an encoder that is configured to receive map data and occupancy data associated with the object as input.

Q: A method comprising: inputting, into a decoder of a variable autoencoder, latent variable data associated with an object in an environment, the latent variable data representing a behavior of the object; receiving, from the decoder and based at least in part on the latent variable data, output data representing a discrete occupancy representation for the object; and at least one of: performing, based at least in part on the output data, a simulation between a robotic device and the object; or controlling, based at least in part on the output data, a robotic device in the environment.

R: The method of paragraph Q, wherein the latent variable data comprises discrete latent variable data representing at least one of an action, an intent, or an attribute of the object for use during the simulation, and further comprising: inputting map data representing the environment into the decoder; and determining, by the decoder, the output data based at least in part on the map data.

S: The method of paragraph Q or R, wherein a first number of channels associated with the output data from the decoder is greater than a second number of channels associated with an input to an encoder of the variable autoencoder.

T: The method of any of paragraphs Q-S, wherein the latent variable data is received from a diffusion model configured to input data and apply an algorithm to denoise the input data.

U: A system comprising: one or more processors; and one or more non-transitory computer-readable media storing instructions executable by the one or more processors, wherein the instructions, when executed, cause the one or more processors to perform operations comprising: receiving, by a diffusion model, data representing conditions of an environment; and generating, by the diffusion model and based at least in part the data, one of: scene data for simulating potential interactions between a vehicle and one or more objects in the environment, or an intermediate output for input into a decoder that is configured to output scene data including the one or more objects.

V: The system of paragraph U, wherein the data comprises a token to represent a potential action of an object of the one or more objects.

W: The system of any of paragraphs A-V, wherein the data comprises a node to represent a potential action of an object of the one or more objects.

X: The system of paragraph U, the operations further comprising: determining a planner cost associated with a planning component of a vehicle computing device, the planner cost indicting an impact on available computational resources for the planning component to determine output data; comparing the planner cost to a cost threshold; and generating the scene data or the intermediate output based at least in part on the planner cost meeting or exceeding the cost threshold.

Y: The system of any of paragraphs U-X, wherein: the data comprises text data describing an intersection type, a number of objects in the environment, or a scene characteristic.

Z: One or more non-transitory computer-readable media storing instructions that, when executed, cause one or more processors to perform operations comprising: receiving, by a denoising model, data representing conditions of an environment; and generating, by the denoising model and based at least in part the data, one of: scene data for simulating potential interactions between a vehicle and one or more objects in the environment, or an intermediate output for input into a decoder that is configured to output scene data including the one or more objects.

AA: The one or more non-transitory computer-readable media of paragraph Z, wherein the denoising model comprises a diffusion model.

AB: The one or more non-transitory computer-readable media of paragraph Z or AA, wherein the data comprises a node or a token to represent a potential action of an object of the one or more objects.

AC: The one or more non-transitory computer-readable media of any of paragraphs Z-AB, the operations further comprising: determining a planner cost associated with a planning component of a vehicle computing device, the planner cost indicting an impact on available computational resources for the planning component to determine output data; comparing the planner cost to a cost threshold; and generating the scene data of the intermediate output based at least in part on the planner cost meeting or exceeding the cost threshold.

AD: The one or more non-transitory computer-readable media of any of paragraphs Z-AC, wherein: the intermediate output represents one or more objects absent from the data.

AE: The one or more non-transitory computer-readable media of any of paragraphs Z-AD, wherein the data comprises text data describing an intersection type, a number of objects, or a scene characteristic to include in the scene data.

AF: The one or more non-transitory computer-readable media of any of paragraphs Z-AE, wherein the data further represents a first action for a first object of the one or more objects and a second action for a second object of the one or more objects.

AG: The one or more non-transitory computer-readable media of any of paragraphs Z-AF, wherein the data is based at least in part on input from a user specifying the condition of the environment at a previous time.

AH: The one or more non-transitory computer-readable media of any of paragraphs Z-AG, wherein the denoising model is configured to apply a denoising algorithm to generate the scene data.

AI: The one or more non-transitory computer-readable media of any of paragraphs Z-AH, wherein the denoising model generates at least one object that do not exist in sensor data from a sensor associated with the vehicle.

AJ: The one or more non-transitory computer-readable media of any of paragraphs Z-AI, wherein the data comprises one of: a vector representation of an object of the one or more objects or a vector representation of the environment.

AK: A method comprising: receiving, by a denoising model, data representing conditions of an environment; and generating, by the denoising model and based at least in part the data, one of: scene data for simulating potential interactions between a vehicle and one or more objects in the environment, or an intermediate output for input into a decoder that is configured to output scene data including the one or more objects.

AL: The method of paragraph AK, wherein the denoising model comprises a diffusion model.

AM: The method of paragraph AK or AL, wherein the data comprises a node or a token to represent a potential action of an object of the one or more objects.

AN: The method of any of paragraphs AK-AM, wherein the data comprises text data describing an intersection type, a number of objects, or a scene characteristic to include in the scene data.

AO: A system comprising: one or more processors; and one or more non-transitory computer-readable media storing instructions executable by the one or more processors, wherein the instructions, when executed, cause the one or more processors to perform operations comprising: inputting, as first input data into an encoder of a variable autoencoder, map data representing an environment and occupancy data associated with an object in the environment; receiving, from the encoder, first output data representing a compressed representation of the first input data; receiving, from a diffusion model, discrete latent variable data associated with the object; inputting, as second input data into a decoder of the variable autoencoder, the first output data from the encoder and the discrete latent variable data from the diffusion model; receiving, from the decoder, second output data representing an occupancy representation for the object in the environment and object state data associated with the object; and training the encoder or the decoder based at least in part on the second output data.

AP: The system of paragraph AO, wherein the discrete latent variable data associated with the object indicates an acceleration action, a braking action, or a steering action of the object.

AQ: The system of paragraph AO or AP, wherein: the map data is associated with a simulated environment, the compressed representation of the first input data represents a latent embedding of the first input data, and the object state data indicates an acceleration, a velocity, an orientation, or a position of the object.

AR: The system of any of paragraphs AO-AQ, the operations further comprising: performing a simulation to verify a response by a vehicle relative to the object; and training, based at least in part on the response, the decoder to output bounding box data for the object.

AS: The system of any of paragraphs AO-AR, the operations further comprising: transmitting the second output data to a vehicle computing device to control a vehicle in the environment.

AT: One or more non-transitory computer-readable media storing instructions that, when executed, cause one or more processors to perform operations comprising: inputting, into an encoder, map data representing an environment and occupancy data associated with an object in the environment; receiving, from the encoder, first output data representing a compressed representation of the map data and the occupancy data; inputting, into a decoder, the first output data from the encoder; receiving, from the decoder, second output data representing an occupancy representation for the object in the environment and object state data associated with the object; and training the encoder or the decoder based at least in part on the second output data.

AU: The one or more non-transitory computer-readable media of paragraph AT, wherein the second output data comprises a trajectory, a velocity, an acceleration, or an orientation associated with the object.

AV: The one or more non-transitory computer-readable media of paragraph AT or AU, wherein: the map data is associated with a simulated environment, the compressed representation represents a latent embedding of data input to the encoder, and the object state data indicates at least one of: a trajectory, an acceleration, a velocity, an orientation, width or length of the object, or a position of the object.

AW: The one or more non-transitory computer-readable media of any of paragraphs AT-AV, the operations further comprising: performing a simulation to verify a response by a vehicle relative to the object; and training, based at least in part on the response, the decoder to output bounding box data for the object.

AX: The one or more non-transitory computer-readable media of any of paragraphs AT-AW, the operations further comprising: transmitting the second output data to a vehicle computing device to control a vehicle in the environment.

AY: The one or more non-transitory computer-readable media of any of paragraphs AT-AX, wherein the encoder and the decoder are components of a variable autoencoder.

AZ: The one or more non-transitory computer-readable media of any of paragraphs AT-AY, wherein training the encoder or the decoder comprises: comparing, as a comparison, the first output data or the second output data to ground truth; and training the encoder or the decoder based at least in part on the comparison.

BA: The one or more non-transitory computer-readable media of any of paragraphs AT-AZ, wherein the occupancy representation comprises a bounding box to represent the object in the environment.

BB: The one or more non-transitory computer-readable media of any of paragraphs AT-BA, wherein the occupancy representation comprises a feature vector to represent the object in the environment.

BC: The one or more non-transitory computer-readable media of any of paragraphs AT-BB, wherein: the object is a first object, the second output data comprises: a first bounding box associated with the first object, a second bounding box associated with a second object, and an orientation or a position of the first object.

BD: The one or more non-transitory computer-readable media of any of paragraphs AT-BC, wherein the occupancy representation comprises a heatmap to represent the object in the environment.

BE: A method comprising: inputting, into an encoder, map data representing an environment and occupancy data associated with an object in the environment; receiving, from the encoder, first output data representing a compressed representation of the map data and the occupancy data; inputting, into a decoder, the first output data from the encoder; receiving, from the decoder, second output data representing an occupancy representation for the object in the environment and object state data associated with the object; and training the encoder or the decoder based at least in part on the second output data.

BF: The method of paragraph BE, wherein the second output data comprises a trajectory, a velocity, or an acceleration associated with the object.

BG: The method of paragraph BE or BF, wherein: the map data is associated with a simulated environment, the compressed representation represents a latent embedding of data input to the encoder, and the object state data indicates an acceleration, a velocity, an orientation, or a position of the object.

BH: The method of any of paragraphs BE-BG, further comprising: performing a simulation to verify a response by a vehicle relative to the object; and training, based at least in part on the response, the decoder to output bounding box data for the object.

BI: A system comprising: one or more processors; and one or more non-transitory computer-readable media storing instructions executable by the one or more processors, wherein the instructions, when executed, cause the one or more processors to perform operations comprising: receiving, by a decoder of a variable autoencoder, map data representing an environment; receiving, by the decoder, discrete latent variable data associated with a first object and a second object; outputting, by the decoder and based at least in part on the map data and the discrete latent variable data, bounding box data representing a first bounding box to represent the first object and a second bounding box to represent the second object, the first bounding box including a first orientation and the second bounding box including a second orientation; inputting the bounding box data into a prediction component associated with a vehicle computing device of an autonomous vehicle; receiving, from the prediction component, output data representing first predicted state data associated with the autonomous vehicle, second predicted state data associated with the first object, and third predicted state data associated with the second object; and performing, based at least in part on the output data, a simulation including the autonomous vehicle, the first object, and the second object.

BJ: The system of paragraph BI, the operations further comprising: controlling the autonomous vehicle in the environment based at least in part on the simulation.

BK: The system of paragraph BI or BJ, wherein the discrete latent variable data is received from a diffusion model that is configured to receive the map data and to receive condition data indicating a condition for use during the simulation, and output the discrete latent variable data based at least in part on applying an algorithm to the map data and the condition data.

BL: The system of any of paragraphs BI-BK, wherein the prediction component comprises a Generative Adversarial Network (GAN), a Graph Neural Network (GNN), or a transformer model.

BM: The system of any of paragraphs BI-BL, wherein the first predicted state data, the second predicted state data, or the third predicted state data includes one or more of position data, orientation data, heading data, velocity data, speed data, acceleration data, yaw rate data, or turning rate data.

BN: One or more non-transitory computer-readable media storing instructions that, when executed, cause one or more processors to perform operations comprising: receiving, by a decoder, latent variable data associated with an object; outputting, by the decoder and based at least in part on the latent variable data, occupancy data including a bounding box to represent the object; and performing, based at least in part on the occupancy data, a simulation including a vehicle and the object.

BO: The one or more non-transitory computer-readable media of paragraph BN, wherein the latent variable data comprises discrete latent variable data representing an action, an intent, or an attribute of the object for use during the simulation.

BP: The one or more non-transitory computer-readable media of paragraph BN or BO, wherein: the object is a first object, the latent variable data is further associated with a second object, the occupancy data comprises a first bounding box to represent the first object and a second bounding box to represent a second object, and the simulation includes the vehicle, the first object, and the second object.

BQ: The one or more non-transitory computer-readable media of paragraph BP, wherein the first bounding box includes a first orientation and the second bounding box includes a second orientation.

BR: The one or more non-transitory computer-readable media of any of paragraphs BN-BQ, wherein the latent variable data is received from a generative model that is conditioned on environment data.

BS: The one or more non-transitory computer-readable media of any of paragraphs BN-BR, wherein the latent variable data is received from a diffusion model that is configured to receive map data and to receive condition data indicating a condition for use during the simulation, and to output the latent variable data based at least in part on applying an algorithm to the map data and the condition data.

BT: The one or more non-transitory computer-readable media of any of paragraphs BN-BS, the operations further comprising: inputting the occupancy data into a prediction component associated with a vehicle computing device of the vehicle; receiving, from the prediction component, object state data associated with the object.

BU: The one or more non-transitory computer-readable media of any of paragraphs BN-BT, the operations further comprising: outputting, by the decoder, state data associated with the vehicle or the object, the state data including one or more of: position data, orientation data, heading data, velocity data, speed data, acceleration data, yaw rate data, or turning rate data, wherein performing the simulation is further based at least in part on the state data.

BV: The one or more non-transitory computer-readable media of any of paragraphs BN-BU, wherein a first number of channels associated with the output data from the decoder is greater than a second number of channels associated with an input to an encoder used to train the decoder.

BW: The one or more non-transitory computer-readable media of any of paragraphs BN-BV, wherein the latent variable data is received from a diffusion model configured to receive input data and apply an algorithm to denoise the input data.

BX: The one or more non-transitory computer-readable media of any of paragraphs BN-BW, wherein the latent variable data is received from a transformer model configured to define a token to represent an action of the object.

BY: A method comprising: receiving, by a decoder, latent variable data associated with an object; outputting, by the decoder and based at least in part on the latent variable data, occupancy data including a bounding box to represent the object; and performing, based at least in part on the occupancy data, a simulation including a vehicle and the object.

BZ: The method of paragraph BY, wherein the latent variable data comprises discrete latent variable data representing an action, an intent, or an attribute of the object for use during the simulation.

CA: The method of paragraph BY or BZ, wherein: the object is a first object, the latent variable data is further associated with a second object, the occupancy data comprises a first bounding box to represent the first object and a second bounding box to represent a second object, and the simulation includes the vehicle, the first object, and the second object.

CB: The method of any of paragraphs BY-CA, further comprising: outputting, by the decoder, state data associated with the vehicle or the object, the state data including one or more of: position data, orientation data, heading data, velocity data, speed data, acceleration data, yaw rate data, or turning rate data, wherein performing the simulation is further based at least in part on the state data.

While the example clauses described above are described with respect to one particular implementation, it should be understood that, in the context of this document, the content of the example clauses can also be implemented via a method, device, system, computer-readable medium, and/or another implementation. Additionally, any of examples A-CB may be implemented alone or in combination with any other one or more of the examples A-CB.

CONCLUSION

While one or more examples of the techniques described herein have been described, various alterations, additions, permutations and equivalents thereof are included within the scope of the techniques described herein.

In the description of examples, reference is made to the accompanying drawings that form a part hereof, which show by way of illustration specific examples of the claimed subject matter. It is to be understood that other examples can be used and that changes or alterations, such as structural changes, can be made. Such examples, changes or alterations are not necessarily departures from the scope with respect to the intended claimed subject matter. While the steps herein can be presented in a certain order, in some cases the ordering can be changed so that certain inputs are provided at different times or in a different order without changing the function of the systems and methods described. The disclosed procedures could also be executed in different orders. Additionally, various computations that are herein need not be performed in the order disclosed, and other examples using alternative orderings of the computations could be readily implemented. In addition to being reordered, the computations could also be decomposed into sub-computations with the same results.

What is claimed is:
1. A system comprising:
one or more processors; and
one or more non-transitory computer-readable media storing instructions executable by the one or more processors, wherein the instructions, when executed, cause the one or more processors to perform operations comprising:
receiving, by a decoder of a variable autoencoder, map data representing an environment;
receiving, by the decoder of the variable autoencoder, discrete latent variable data associated with a first object and a second object;
outputting, by the decoder of the variable autoencoder and based at least in part on the map data and the discrete latent variable data, bounding box data representing a first bounding box to represent the first object and a second bounding box to represent the second object, the first bounding box including a first orientation and the second bounding box including a second orientation;

inputting the bounding box data output by the variable autoencoder into a prediction component associated with a vehicle computing device of an autonomous vehicle;

receiving, from the prediction component, output data representing first predicted state data associated with the autonomous vehicle, second predicted state data associated with the first object, and third predicted state data associated with the second object; and performing, based at least in part on the output data, a simulation including to control the autonomous vehicle relative to the first object and the second object.

2. The system of claim 1, the operations further comprising:

controlling the autonomous vehicle in the environment based at least in part on the simulation.

3. The system of claim 1, wherein the discrete latent variable data is received from a diffusion model that is configured to receive the map data and to receive condition data indicating a condition for use during the simulation, and output the discrete latent variable data based at least in part on applying an algorithm to the map data and the condition data.

4. The system of claim 1, wherein the prediction component comprises a Generative Adversarial Network (GAN), a Graph Neural Network (GNN), or a transformer model.

5. The system of claim 1, wherein the first predicted state data, the second predicted state data, or the third predicted state data includes one or more of position data, orientation data, heading data, velocity data, speed data, acceleration data, yaw rate data, or turning rate data.

6. One or more non-transitory computer-readable media storing instructions that, when executed, cause one or more processors to perform operations comprising:

receiving, by a decoder of a variable autoencoder, latent variable data associated with an object;

outputting, by the decoder of the variable autoencoder and based at least in part on the latent variable data, occupancy data including a bounding box to represent the object; and performing, based at least in part on the occupancy data, a simulation to control a vehicle relative to the object.

7. The one or more non-transitory computer-readable media of claim 6, wherein the latent variable data comprises discrete latent variable data representing an action, an intent, or an attribute of the object for use during the simulation.

8. The one or more non-transitory computer-readable media of claim 6, wherein:

the object is a first object, the latent variable data is further associated with a second object, the occupancy data comprises a first bounding box to represent the first object and a second bounding box to represent the second object, and the simulation includes the vehicle, the first object, and the second object.

9. The one or more non-transitory computer-readable media of claim 8, wherein:

the first bounding box includes a first orientation and the second bounding box includes a second orientation.

10. The one or more non-transitory computer-readable media of claim 6, wherein the latent variable data is received from a generative model that is conditioned on environment data.

11. The one or more non-transitory computer-readable media of claim 6, wherein the latent variable data is received from a diffusion model that is configured to receive map data and to receive condition data indicating a condition for use during the simulation, and to output the latent variable data based at least in part on applying an algorithm to the map data and the condition data.

12. The one or more non-transitory computer-readable media of claim 6, the operations further comprising:

inputting the occupancy data into a prediction component associated with a vehicle computing device of the vehicle; and receiving, from the prediction component, object state data associated with the object.

13. The one or more non-transitory computer-readable media of claim 6, the operations further comprising:

outputting, by the decoder, state data associated with the vehicle or the object, the state data including one or more of: position data, orientation data, heading data, velocity data, speed data, acceleration data, yaw rate data, or turning rate data, wherein performing the simulation is further based at least in part on the state data.

14. The one or more non-transitory computer-readable media of claim 6, wherein a first number of channels associated with the occupancy data from the decoder is greater than a second number of channels associated with an input to an encoder used to train the decoder.

15. The one or more non-transitory computer-readable media of claim 6, wherein the latent variable data is received from a diffusion model configured to receive input data and apply an algorithm to denoise the input data.

16. The one or more non-transitory computer-readable media of claim 6, wherein the latent variable data is received from a transformer model configured to define a token to represent an action of the object.

17. A method comprising:

receiving, by a decoder of a variable autoencoder, latent variable data associated with an object;

outputting, by the decoder of the variable autoencoder and based at least in part on the latent variable data, occupancy data including a bounding box to represent the object; and performing, based at least in part on the occupancy data, a simulation to control a vehicle relative to the object.

18. The method of claim 17, wherein the latent variable data comprises discrete latent variable data representing an action, an intent, or an attribute of the object for use during the simulation.

19. The method of claim 17, wherein:

the object is a first object, the latent variable data is further associated with a second object, the occupancy data comprises a first bounding box to represent the first object and a second bounding box to represent the second object, and the simulation includes the vehicle, the first object, and the second object.

20. The method of claim 17, further comprising:

outputting, by the decoder, state data associated with the vehicle or the object, the state data including one or more of: position data, orientation data, heading data, velocity data, speed data, acceleration data, yaw rate data, or turning rate data,
wherein performing the simulation is further based at least in part on the state data.

* * * * *